US012615933B2

(12) United States Patent
Zhu

(10) Patent No.: US 12,615,933 B2
(45) Date of Patent: Apr. 28, 2026

(54) PIXEL CIRCUIT AND DRIVING METHOD, DISPLAY PANEL AND DRIVING METHOD, DISPLAY DEVICE

(71) Applicant: BOE Technology Group Co., Ltd., Beijing (CN)

(72) Inventor: Jianchao Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 196 days.

(21) Appl. No.: 18/250,428

(22) PCT Filed: Feb. 25, 2022

(86) PCT No.: PCT/CN2022/078059
§ 371 (c)(1),
(2) Date: Apr. 25, 2023

(87) PCT Pub. No.: WO2023/159503
PCT Pub. Date: Aug. 31, 2023

(65) Prior Publication Data
US 2025/0081763 A1 Mar. 6, 2025

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01); *G09G 2300/0819* (2013.01); *G09G 2300/0842* (2013.01); *G09G 2300/0861* (2013.01); *G09G 2310/08* (2013.01)

(58) Field of Classification Search
CPC ...... H10K 59/131; G09G 3/3233; G09G 3/32; G09G 2300/0426; G09G 2300/0819; G09G 2300/0842; G09G 2300/0861; G09G 2310/08
USPC ................................................... 345/76, 691
See application file for complete search history.

(56) References Cited

U.S. PATENT DOCUMENTS

| | | | | |
|---|---|---|---|---|
| 11,049,458 | B1 * | 6/2021 | Fan ....................... | G09G 3/3266 |
| 2007/0057877 | A1 * | 3/2007 | Choi .................... | G09G 3/3291 |
| | | | | 345/76 |

FOREIGN PATENT DOCUMENTS

| | | |
|---|---|---|
| CN | 105355170 A | 2/2016 |
| CN | 210984240 U | 7/2020 |
| CN | 111627393 A | 9/2020 |

(Continued)

OTHER PUBLICATIONS

Written Opinion from PCT/CN2022/078059 dated Dec. 7, 2022.

(Continued)

*Primary Examiner* — Jimmy H Nguyen
(74) *Attorney, Agent, or Firm* — Calfee, Halter & Griswold LLP

(57) ABSTRACT

The present application relates to a pixel circuit and a driving method thereof, a display panel and a driving method thereof, and a display device. The pixel circuit comprises: a driving circuit, connected to a first node, a second node, and a third node; an isolation circuit, connected to the first node, a fourth node, and a first gate driving signal terminal; a compensation circuit, connected to the third node, the fourth node, and a second gate driving signal terminal; a first reset circuit, connected to the fourth node, a first reset signal terminal, and a first initial signal terminal.

3 Claims, 25 Drawing Sheets

(56) References Cited

FOREIGN PATENT DOCUMENTS

| | | | |
|---|---|---|---|
| CN | 111682058 | A | 9/2020 |
| CN | 113838424 | A | 12/2021 |
| CN | 114038419 | A | 2/2022 |
| JP | 2005326793 | A | 11/2005 |

OTHER PUBLICATIONS

International Search Report from PCT/CN2022/078059 dated Dec. 7, 2022.
First Office Action of CN application No. 2022800002851 dated Mar. 17, 2026.

* cited by examiner

PIXEL CIRCUIT AND DRIVING METHOD, DISPLAY PANEL AND DRIVING METHOD, DISPLAY DEVICE

CROSS REFERENCE TO RELATED APPLICATION(S)

The present disclosure is a 35 U.S.C. 371 national phase application of PCT International Application No. PCT/CN2022/078059 filed on Feb. 25, 2022, the entire disclosure of which is incorporated herein as a part of the present application for all purposes.

TECHNICAL FIELD

The present disclosure relates to the field of display technology, and in particular to a pixel circuit and a driving method thereof, a display panel and a driving method thereof, and a display device.

BACKGROUND

In the related art, a pixel circuit in a display panel usually includes a driving transistor, and the driving transistor provides a driving current to a light-emitting unit according to a gate voltage thereof. However, in the light-emitting phase of the pixel circuit, the charge at the gate of the driving transistor will leak through other transistors, thereby affecting the display effect.

It should be noted that the information disclosed in the Background section is only for enhancing the understanding of the background of the present disclosure, and therefore may include information that does not constitute the prior art known to those of ordinary skill in the art.

SUMMARY

According to one aspect of the present disclosure, a pixel circuit is provided. The pixel circuit includes: a driving circuit, an isolation circuit, a compensation circuit, and a first reset circuit. The driving circuit is connected to the first node, the second node, and the third node, and is used for inputting a driving current to the third node through the second node according to the signal at the first node. The isolation circuit is connected to the first node, the fourth node, and the first gate driving signal terminal, and is used for connecting the first node and the fourth node in response to the signal at the first gate driving signal terminal. The compensation circuit is connected to the third node, the fourth node, and the second gate driving signal terminal, and is used for connecting the third node and the fourth node in response to the signal at the second gate driving signal terminal. The first reset circuit is connected to the fourth node, the first reset signal terminal, and the first initial signal terminal, and is used for transmitting the first initial signal terminal to the fourth node in response to the signal at the first reset signal terminal.

In an exemplary embodiment of the present disclosure, the driving circuit includes: a driving transistor, having a first terminal connected to the second node, a second terminal connected to the third node, and a gate connected to the first node. The isolation circuit includes: an eighth transistor, having a first terminal connected to the first node, a second terminal connected to the fourth node, and a gate connected to the first gate driving signal terminal. The compensation circuit includes: a second transistor, having a first terminal connected to the fourth node, a second terminal connected to the third node, and a gate connected to the second gate driving signal terminal. The first reset circuit includes: a first transistor, having a first terminal connected to the first initial signal terminal, a second terminal connected to the fourth node, and a gate connected to the first reset signal terminal.

In an exemplary embodiment of the present disclosure, the eighth transistor is an N-type transistor, and the first transistor, the driving transistor, and the second transistor are P-type transistors.

In an exemplary embodiment of the present disclosure, the pixel circuit is used for driving the light-emitting unit to emit light. The pixel circuit further includes: a light-emission control circuit, a second reset circuit, a data writing circuit, and a storage circuit. The light-emission control circuit is connected to the first power supply terminal, the second node, the third node, the first electrode of the light-emitting unit, and an enable signal terminal, and is used for connecting the first power supply terminal and the second node in response to the signal at the enable signal terminal, and is used for connecting the third node and the first electrode of the light-emitting unit in response to the signal at the enable signal terminal. The second reset circuit is connected to the first electrode of the light-emitting unit, the second initial signal terminal, and the second reset signal terminal, and is used for transmitting the signal at the second initial signal terminal to the first electrode of the light-emitting unit in response to the signal at the second reset signal terminal. The data writing circuit is connected to the second node, the data signal terminal, and the second gate driving signal terminal, and is used for transmitting the signal at the data signal terminal to the second node in response to the signal at the second gate driving signal terminal. The storage circuit is connected between the first power supply terminal and the first node.

In an exemplary embodiment of the present disclosure, the light-emission control circuit includes: a fifth transistor and a sixth transistor. The fifth transistor has a first terminal connected to the first power supply terminal, a second terminal connected to the second node, and a gate connected to the enable signal terminal. The sixth transistor has a first terminal connected to the third node, a second terminal connected to the first electrode of the light-emitting unit, and a gate connected to the enable signal terminal. The second reset circuit includes: a seventh transistor, having a first terminal connected to the second initial signal terminal, a second terminal connected to the first electrode of the light-emitting unit, and a gate connected to the second reset signal terminal. The data writing circuit includes: a fourth transistor, having a first terminal connected to the data signal terminal, a second terminal connected to the second node, and a gate connected to the second gate driving signal terminal. The storage circuit includes: a capacitor connected between the first power supply terminal and the first node.

In an exemplary embodiment of the present disclosure, the fourth transistor, the fifth transistor, the sixth transistor, and the seventh transistor are all P-type transistors.

According to one aspect of the present disclosure, there is provided a pixel circuit driving method, for driving the above-mentioned pixel circuit. The pixel circuit driving method includes:

in a reset phase, inputting an active electrical level to the first reset signal terminal and the first gate driving signal terminal, and inputting an inactive electrical level to the second gate driving signal terminal;

in a compensation phase, inputting an active electrical level to the second gate driving signal terminal and the first gate driving signal terminal, and inputting an inactive electrical level to the first reset signal terminal; and in a light-emitting phase, inputting an inactive electrical level to the second gate driving signal terminal, the first gate driving signal terminal, and the first reset signal terminal.

According to one aspect of the present disclosure, a display panel is provided, the display panel including the above-mentioned pixel circuit.

In an exemplary embodiment of the present disclosure, the display panel includes: a plurality of pixel circuits, a plurality of first data lines, and a plurality of second data lines. The plurality of pixel circuits are arranged in an array along the row and column directions. Each column of pixel circuits is provided with a respective one of the first data lines. The first data line is connected to the data signal terminal of the respective odd row of pixel circuits. Each column of pixel circuits is provided with a respective one of the second data lines. The second data line is connected to the data signal terminal of the respective even row of pixel circuits.

In an exemplary embodiment of the present disclosure, when the pixel circuit includes a light-emission control circuit connected to the enable signal terminal, the display panel further includes: a plurality of first gate lines, a plurality of second gate lines, a plurality of enable signal lines, and a plurality of pixel circuit groups. Each row of pixel circuits is provided with a respective one of the first gate lines. The first gate line is connected to the first gate driving signal terminal in the respective pixel circuit. Each row of pixel circuits is provided with a respective one of the second gate lines. The second gate line is connected to the second gate driving signal terminal in the respective pixel circuit. Each row of pixel circuits is provided with a respective enable signal line, and the enable signal line is connected to the enable signal terminal in the respective pixle circuit. Each pixel circuit group includes two adjacent rows of pixel circuits. In the same pixel circuit group, the signals at two of the first gate lines are the same in timing, signals at two of the second gate lines are the same in timing, and signals at two of the enable signal lines are the same in timing.

In an exemplary embodiment of the present disclosure, when the pixel circuit includes a second reset circuit connected to the second reset signal terminal, the display panel further includes: a plurality of reset signal lines. Each row of pixel circuits is provided with a respective one of the reset signal lines. The reset signal line is connected to the first reset signal terminal in a respective row of pixel circuits and the second reset signal terminal in a previous row of pixel circuits. In the same pixel circuit group, signals at two of the reset signal lines are the same in timing.

According to one aspect of the present disclosure, there is provided a display panel driving method, for driving the above-mentioned display panel. The pixel circuits in the display panel form a plurality of pixel circuit groups, and each of the pixel circuit groups includes two adjacent rows of pixel circuits.

The display panel driving method includes: sequentially scanning the pixel circuit groups, while within the scanning period of the pixel circuit group, providing data signals to the pixel circuits in the pixel circuit group respectively through the first data line and the second data line.

According to one aspect of the present disclosure, a display panel is provided. The display panel includes a pixel circuit, and the pixel circuit includes: a driving transistor, an eighth transistor, a second transistor, and a first transistor. The eighth transistor has a first terminal connected to the gate of the driving transistor, and a gate connected to the first gate line. The second transistor has a first terminal connected to the second terminal of the eighth transistor, a second terminal connected to the second terminal of the driving transistor, and a gate connected to the second gate line. The first transistor has a first terminal connected to the first initial signal line, a second terminal connected to the second terminal of the eighth transistor, and a gate connected to the first reset signal line. The display panel further includes: a base substrate, a first active layer, a first conductive layer, a second active layer, and a third conductive layer. The first active layer is located on a side of the base substrate. The first active layer includes: a first active portion, a second active portion, and a third active portion. The first active portion is used for forming the channel region of the first transistor. The second active portion is used for forming the channel region of the second transistor. The third active portion is used for forming the channel region of the driving transistor. The first conductive layer is located on a side of the first active layer away from the base substrate. The first conductive layer includes: the first conductive portion, the first reset signal line, and the second gate line. The orthographic projection of the first conductive portion on the base substrate covers the orthographic projection of the third active portion on the base substrate, and is used for forming the gate of the driving transistor. The orthographic projection of the first reset signal line on the base substrate extends along the first direction and covers the orthographic projection of the first active portion on the base substrate. Part of the first reset signal line is used for forming the gate of the first transistor. The orthographic projection of the second gate line on the base substrate extends along the first direction and covers the orthographic projection of the second active portion on the base substrate. Part of the second gate line is used for forming the gate of the second transistor. The second active layer is located on a side of the first conductive layer away from the base substrate. The second active layer includes: an eighth active portion for forming the channel region of the eighth transistor. The third conductive layer is located on a side of the second active layer away from the base substrate. The third conductive layer includes the first gate line. The orthographic projection of the first gate line on the base substrate extends along the first direction and covers the orthographic projection of the eighth active portion on the base substrate. Part of the first gate line is used for forming the top gate of the eighth transistor.

In an exemplary embodiment of the present disclosure, the pixel circuit is used for driving the light-emitting unit to emit light. The pixel circuit further includes: a fourth transistor, a fifth transistor, a sixth transistor, and a seventh transistor. The fourth transistor has a first terminal connected to the data line, a second terminal connected to the first terminal of the driving transistor, and a gate connected to the second gate line. The fifth transistor has a first terminal connected to the first power supply line, a second terminal connected to the first terminal of the driving transistor, and a gate connected to the enable signal line. The sixth transistor has a first terminal connected to the second terminal of the driving transistor, a second terminal connected to the first electrode of the light-emitting unit, and a gate connected to the enable signal line. The seventh transistor has a first terminal connected to the second initial signal terminal, a second terminal connected to the first electrode of the light-emitting unit, and a gate connected to the second reset signal line. The first active layer further includes: a fourth active portion, a fifth active portion, a sixth active portion, and a seventh active portion. The fourth active portion is used for forming a channel region of the fourth transistor. The orthographic projection of the second gate line on the base substrate covers the orthographic projection of the fourth active portion on the base substrate. Part of the second gate line is used for forming the gate of the fourth transistor. The fifth active portion is used for forming the channel region of the fifth transistor. The sixth active portion is used for forming the channel region of the sixth transistor. The seventh active portion is used for forming the channel region of the seventh transistor. The first conductive layer further includes: the enable signal line, and the second reset signal line. The orthographic projection of the enable signal line on the base substrate extends along the first direction and covers the orthographic projection of the fifth active portion on the base substrate and the orthographic projection of the sixth active portion on the base substrate. Parts of the enable signal line are respectively used for forming gates of the fifth transistor and the sixth transistor. The orthographic projection of the second reset signal line on the base substrate extends along the first direction and covers the orthographic projection of the seventh active portion on the base substrate. Part of the second reset signal line is used for forming the gate of the seventh transistor.

In an exemplary embodiment of the present disclosure, the display panel includes a plurality of pixel circuits arranged in an array along a first direction and a second direction. The first direction is a row direction, and the second direction is a column direction. In each column of pixel circuits, the plurality of pixel circuits include a first pixel circuit and a second pixel circuit that are sequentially and alternately arranged in the column direction. The display panel further includes a fifth conductive layer. The fifth conductive layer is located on the side of the third conductive layer away from the base substrate. The fifth conductive layer includes a plurality of data lines. The orthographic projection of the data line on the base substrate extends along the second direction. The plurality of data lines include: a plurality of first data lines and a plurality of second data lines. Each column of pixel circuits is provided with a respective one of first data lines, and the first data line is connected to the respective first pixel circuit. Each column of pixel circuits is provided with a respective one of second data lines, and the second data line is connected to the respective second pixel circuit.

In an exemplary embodiment of the present disclosure, the display panel further includes a fourth conductive layer, and the fourth conductive layer is located between the third conductive layer and the fifth conductive layer. The fourth conductive layer includes: a first bridge part and a second bridge part. The first bridge part is located in the second pixel circuit. The first bridge part is connected to the second data line through a via hole, and is further connected to the first terminal of the fourth transistor in the second pixel circuit. The second bridge part is located in the first pixel circuit. The second bridge part is connected to the second data line through a via hole. The second bridge part is insulated from the first terminal of the fourth transistor in the first pixel circuit.

In an exemplary embodiment of the present disclosure, the display panel includes: a plurality of conductive structures, and each of the pixel circuits is provided with a respective one of the conductive structures. The orthographic projection of the first bridge part on the base substrate overlaps with the orthographic projection of the conductive structure in the second pixel circuit on the base substrate. The orthographic projection of the second bridge part on the base substrate overlaps with the orthographic projection of the conductive structure in the first pixel circuit on the base substrate.

In an exemplary embodiment of the present disclosure, the conductive structure includes an eleventh active portion. The eleventh active portion is located in the first active layer, and the eleventh active portion is connected between the first active portion and the second active portion.

In an exemplary embodiment of the present disclosure, the first reset signal line includes a plurality of first reset signal line segments. The orthographic projections of the plurality of first reset signal line segments on the base substrate extend along the first direction and are arranged at intervals along the first direction. The display panel further includes a fourth conductive layer. The fourth conductive layer is located on the side of the third conductive layer away from the base substrate. The fourth conductive layer also includes a first connection line. The orthographic projection of the first connection line on the base substrate extends along the first direction, and the first connection line connects each of the first reset signal line segments in the same first reset signal line through a via hole.

In an exemplary embodiment of the present disclosure, the second gate line includes a plurality of second gate line segments. The orthographic projections of the plurality of second gate line segments on the base substrate extend along the first direction and are arranged at intervals along the first direction. The display panel further includes a fourth conductive layer. The fourth conductive layer is located on a side of the third conductive layer away from the base substrate. The fourth conductive layer further includes a second connection line. The orthographic projection of the second connection line on the base substrate extends along the first direction, and the second connection line connects each of the second gate line segments in the same second gate line through a via hole.

In an exemplary embodiment of the present disclosure, the fourth conductive layer further includes: a first protrusion connected to the second connection line, and the orthographic projection of the first protrusion on the base substrate extends along a second direction that intersects with the first direction. The display panel further includes a second conductive layer, and the second conductive layer is located between the first conductive layer and the second active layer. The second conductive layer includes a second conductive portion, and the orthographic projection of the second conductive portion on the base substrate at least partially overlaps with the orthographic projection of the first conductive portion on the base substrate. The second conductive portion is connected to the first protrusion through a via hole.

In an exemplary embodiment of the present disclosure, the display panel further includes a second conductive layer and a sixth conductive layer. The second conductive layer is located between the first conductive layer and the second active layer. The second conductive layer further includes the first initial signal line. The orthographic projection of the first initial signal line on the base substrate extends along the first direction. The sixth conductive layer is located on the side of the third conductive layer away from the base substrate. The sixth conductive layer includes a third connection line. The orthographic projection of the third connection line on the base substrate extends along the second direction. The third connection line is connected to the first initial signal line at least partially intersected therewith through a via hole. The second direction intersects with the first direction.

In an exemplary embodiment of the present disclosure, the display panel further includes a second conductive layer and a sixth conductive layer. The second conductive layer is located between the first conductive layer and the second active layer. The second conductive layer further includes the second initial signal line. The orthographic projection of the second initial signal line on the base substrate extends along the first direction. The sixth conductive layer is located on the side of the third conductive layer away from the base substrate. The sixth conductive layer includes a fourth connection line, and the orthographic projection of the fourth connection line on the base substrate extends along the second direction. The fourth connection line is connected to the second initial signal line at least partially intersected therewith through a via hole. The second direction intersects with the first direction.

In an exemplary embodiment of the present disclosure, the pixel circuit is used for driving the light-emitting unit to emit light, and the second electrode of the light-emitting unit is connected to the second power supply line. The display panel further includes a sixth conductive layer. The sixth conductive layer is located on the side of the third conductive layer away from the base substrate. The sixth conductive layer includes the second power supply line. The orthographic projection of the second power supply line on the base substrate extends along the second direction, and the second power supply line is connected to the second electrode of the light-emitting unit through a via hole.

In an exemplary embodiment of the present disclosure, the display panel further includes a second conductive layer. The second conductive layer is located between the first conductive layer and the second active layer. The second conductive layer further includes: the first initial signal line, and the second initial signal line. The orthographic projection of the first initial signal line on the base substrate extends along the first direction. The orthographic projection of the second initial signal line on the base substrate extends along the first direction. The sixth conductive layer further includes: a third connection line and a fourth connection line. The orthographic projection of the third connection line on the base substrate extends along the second direction, and the third connection line is connected to the first initial signal line at least partially intersected therewith through a via hole. The second direction intersects with the first direction. The orthographic projection of the fourth connection line on the base substrate extends along the second direction, and the fourth connection line is connected to the second initial signal line at least partially intersected therewith through a via hole. Every three adjacent columns of pixel circuits are provided with a respective third connection line, a respective fourth connection line, and a respective second power supply line.

In an exemplary embodiment of the present disclosure, the first power supply line includes a first sub-power supply line and a second sub-power supply line connected to each other. The display panel further includes: a fifth conductive layer, and a sixth conductive layer. The fifth conductive layer is located on the side of the third conductive layer away from the base substrate. The fifth conductive layer includes the first sub-power supply line. The orthographic projection of the first sub-power supply line on the base substrate extends along the second direction. The second direction intersects with the first direction. The sixth conductive layer is located on the side of the fifth conductive layer away from the base substrate. The sixth conductive layer includes the second sub-power supply line. The orthographic projection of the second sub-power supply line on the base substrate extends along the second direction and overlaps with the orthographic projection of the first sub-power supply line on the base substrate. The second sub-power supply line is connected to the first sub-power supply line through a via hole.

In an exemplary embodiment of the present disclosure, the display panel includes a plurality of pixel circuits arranged in an array along the first direction and the second direction. The pixel circuit further includes a capacitor connected between the gate of the driving transistor and the first power supply line. The display panel includes a plurality of first power supply lines. The orthographic projection of the first power supply line on the base substrate extends along the second direction. The first conductive portion is also used for forming the first electrode of the capacitor. The display panel further includes a second conductive layer. The second conductive layer includes: a plurality of third conductive portions, and a plurality of connection parts. The orthographic projection of the third conductive portion on the base substrate overlaps with the orthographic projection of the first conductive portion on the base substrate. The third conductive portion is used for forming the second electrode of the capacitor. The third conductive portion is connected to the first power supply line. The third conductive portions in two adjacent pixel circuits along the first direction are connected through the connection part.

In an exemplary embodiment of the present disclosure, the first transistor, the second transistor, the driving transistor, the fourth transistor, the fifth transistor, the sixth transistor, and the seventh transistor are P-type transistors; and the eighth transistor is an N-type transistor.

In an exemplary embodiment of the present disclosure, the display panel includes a plurality of pixel circuits arranged in an array along a first direction and a second direction. The first direction is a row direction, and the second direction is a column direction. The first reset signal line in the pixel circuit of a row is re-used as the second reset signal line in the pixel circuit of a previous row.

In an exemplary embodiment of the present disclosure, the orthographic projection of the first gate line on the base substrate is located between the orthographic projection of the first conductive portion on the base substrate and the orthographic projection of the second gate line on the base substrate.

According to one aspect of the present disclosure, a display device is provided, which includes the above-mentioned display panel.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the present specification, illustrate embodiments consistent with the present disclosure and together with the description serve to explain the principle of the present disclosure. Apparently, the drawings in the following description are only some embodiments of the present disclosure, and those skilled in the art can obtain other drawings according to these drawings without creative efforts.

DETAILED DESCRIPTION OF THE EMBODIMENTS

Figures 1, 2:
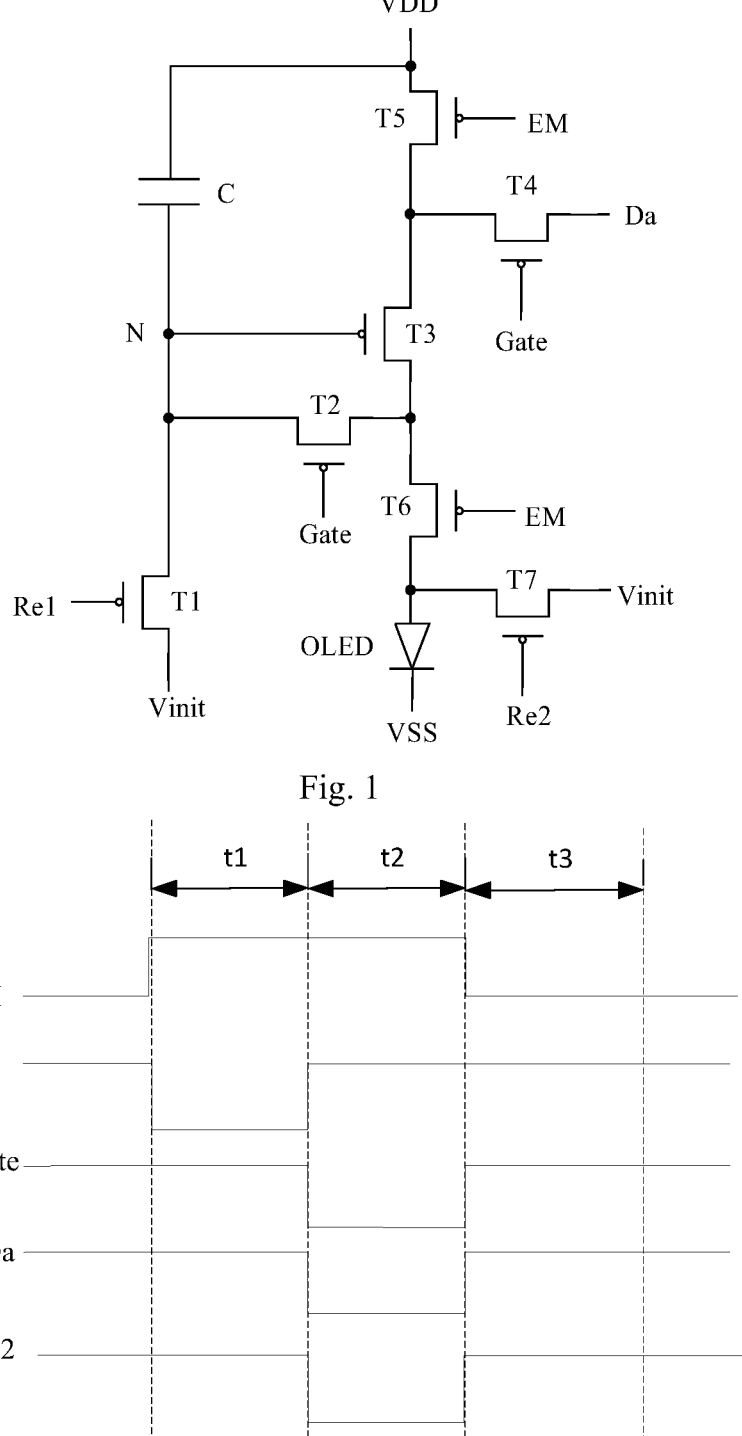
FIG. 1 is a schematic diagram of a circuit structure of a pixel circuit in the related art.
FIG. 2 is a timing diagram of each node in a driving method of the pixel circuit shown in FIG. 1.

Example embodiments will now be described more fully with reference to the accompanying drawings. Example embodiments may, however, be embodied in many forms and should not be construed as limited to the examples set forth herein. Rather, these embodiments are provided so that the present disclosure will be thorough and complete, and will fully convey the concept of example embodiments to those skilled in the art. The same reference numerals in the drawings denote the same or similar structures, and thus their detailed descriptions will be omitted.

The terms "a", "an" and "the" are used to indicate the presence of one or more elements or components, etc. Additional elements or components, etc. may be present in addition to the listed elements or components, etc.

As shown in FIG. 1, it is a schematic circuit structure diagram of a pixel circuit in an exemplary embodiment of a display panel in the related art. The pixel circuit may include a first transistor T1, a second transistor T2, a driving transistor T3, a fourth transistor T4, a fifth transistor T5, a sixth transistor T6, a seventh transistor T7, and a capacitor C. The first transistor T1 has the first terminal connected to the node N, the second terminal connected to the initial signal terminal Vinit, and the gate connected to the reset signal terminal Re1. The second transistor T2 has the first terminal connected to the first terminal of the driving transistor T3, the second terminal connected to the node N, and the gate connected to the gate driving signal terminal Gate. The gate of the driving transistor T3 is connected to the node N. The fourth transistor T4 has the first terminal connected to the data signal terminal Da, the second terminal connected to the second terminal of the driving transistor T3, and the gate connected to the gate driving signal terminal Gate. The fifth transistor T5 has the first terminal connected to the first power supply terminal VDD, the second terminal connected to the second terminal of the driving transistor T3, and the gate connected to the enable signal terminal EM. The sixth transistor T6 has the first terminal connected to the first terminal of the driving transistor T3, and the gate connected to the enable signal terminal EM. The seventh transistor T7 has the first terminal connected to the initial signal terminal Vinit, the second terminal connected to the second terminal of the sixth transistor T6, and the gate connected to the reset signal terminal Re2. The capacitor C is connected between the gate of the driving transistor T3 and the first power supply terminal VDD. The pixel circuit may be connected to a light-emitting unit OLED for driving the light-emitting unit OLED to emit light. The light-emitting unit OLED may be connected between the second terminal of the sixth transistor T6 and the second power supply terminal VSS. The transistors T1-T7 may all be P-type transistors.

As shown in FIG. 2, it is a timing diagram of each node in a driving method of the pixel circuit shown in FIG. 1. Gate indicates the timing of the gate driving signal terminal Gate, Re1 indicates the timing of the reset signal terminal Re1, Re2 indicates the timing of the reset signal terminal Re2, EM indicates the timing of the enable signal terminal EM, and Da indicates the timing of the data signal terminal Da. The driving method of the pixel circuit may include a reset phase t1, a compensation phase t2, and a light-emitting phase t3. In the reset phase t1: the reset signal terminal Re1 outputs a low-level signal; the first transistor T1 is turned on; and the initial signal terminal Vinit inputs an initial signal to the node N. In the compensation stage t2: the reset signal terminal Re2 and the gate driving signal terminal Gate output a low-level signal; the fourth transistor T4, the second transistor T2, and the seventh transistor T7 are turned on; and at the same time, the data signal terminal Da outputs a data signal for writing the voltage Vdata+Vth to the node N. Vdata is the voltage at the data signal, Vth is the threshold voltage at the driving transistor T3, and the initial signal terminal Vinit inputs the initial signal to the second terminal of the sixth transistor T6. In the light-emitting stage t3: the enable signal terminal EM outputs a low-level signal; the sixth transistor T6 and the fifth transistor T5 are turned on; and the driving transistor T3 emits light under the effect of the voltage Vdata+Vth at the node N. The formula about driving transistor's output current is I=(μWCox/2L)(Vgs−Vth)2, where μ is the carrier mobility, Cox is the gate capacitance per unit area, W is the width of the driving transistor channel, and L is the length of the driving transistor channel, Vgs is the gate-source voltage difference of the driving transistor, and Vth is the threshold voltage of the driving transistor. The output current I of the driving transistor in the pixel circuit of the present disclosure is $(\mu WCox/2L)(Vdata+Vth-Vdd-Vth)^2$. The pixel circuit can avoid the influence of the threshold value of the driving transistor on its output current.

However, in the related art, when the pixel circuit is in the light-emitting phase, the charge at the node N tends to leak through the first transistor T1 and the second transistor T2, thereby affecting the display effect.

Figure 3:
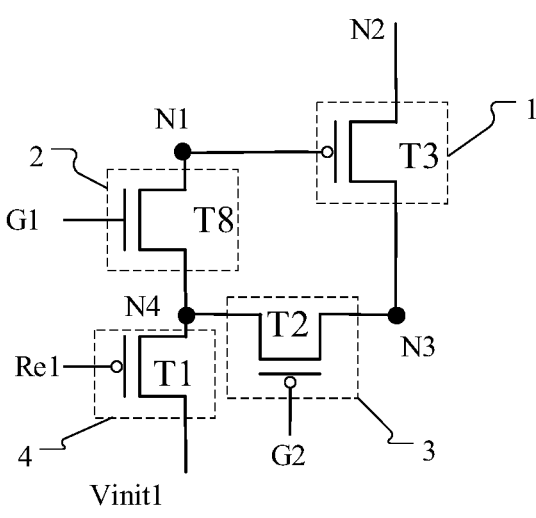
FIG. 3 is a schematic structural diagram of a pixel circuit according to an exemplary embodiment of the present disclosure.

In view of above, an exemplary embodiment of the present disclosure provides a pixel circuit, as shown in FIG. 3, which is a schematic structural diagram of a pixel circuit according to an exemplary embodiment of the present disclosure. The pixel circuit may include: a driving circuit 1, an isolation circuit 2, a compensation circuit 3, and a first reset circuit 4. The driving circuit 1 is connected to the first node N1, the second node N2, and the third node N3, for inputting a driving current to the third node N3 through the second node N2 according to the signal at the first node N1. The isolation circuit 2 is connected to the first node N1, the fourth node N4, and the first gate driving signal terminal G1, for connecting the first node N1 and the fourth node N4 in response to the signal at the first gate driving signal terminal G1. The compensation circuit 3 is connected to the third node N3, the fourth node N4, and the second gate driving signal terminal G2, for connecting the third node N3 and the fourth node N4 in response to the signal at the second gate driving signal terminal G2. The first reset circuit 4 is connected to the fourth node N4, the first reset signal terminal Re1, and the first initial signal terminal Vinit1, for transmitting the signal at the first initial signal terminal Vinit1 to the fourth node N4 in response to the signal at the first reset signal terminal Re1.

In an exemplary embodiment, during the reset phase, the pixel circuit may input an active electrical level to the first reset signal terminal Re1 and the first gate driving signal terminal G1, and input an inactive electrical level to the second gate driving signal terminal G2; the isolation circuit causes a conduction between the first node N1 and the fourth node N4; the first reset circuit transmits the initial signal at the first initial signal terminal Vinit1 to the fourth node N4, and resets the first node N1 through the fourth node N4. During the compensation stage, the pixel circuit may input an active electrical level to the second gate driving signal terminal G2 and the first gate driving signal terminal G1, and input an inactive electrical level to the first reset signal terminal Re1; the isolation circuit causes a conduction between the first node N1 and the fourth node N4; the compensation circuit causes a conduction between the fourth node and the third node; and the driving transistor forms a diode connection structure, so that the threshold-compensated data signal may be written to the first node N1. During the light-emitting phase, the pixel circuit may input an inactive electrical level to the second gate driving signal terminal G2, the first gate driving signal terminal G1, and the first reset signal terminal Re1; the isolation circuit turns off the first node N1 and the fourth node N4; the compensation circuit turns off the fourth node and the third node; the first reset circuit turns off the fourth node N4 and the first initial signal terminal Vinit1; the charge at the first node N1 needs to pass through the isolation circuit before leaked through the compensation circuit 1 and the first reset circuit. Apparently, the pixel circuit increases the difficulty of electric leakage at the first node during the light-emitting stage, and improves the problem of electric leakage at the first node.

It should be noted that, in an exemplary embodiment, the active electrical level refers to an electrical level that can drive the target circuit to work. For example, when the target circuit is an N-type transistor, the active electrical level is a high level, and when the target circuit is a P-type transistor, the active electrical level is a low level. The transistors used in all embodiments of the present disclosure may be thin film transistors or field effect transistors or other devices with the same characteristics. In the present specification, the first terminal may be a drain and the second terminal may be a source, or the first terminal may be a source and the second terminal may be a drain.

In an exemplary embodiment, as shown in FIG. 3, the driving circuit 1 may include a driving transistor T3. The driving transistor T3 has the first terminal connected to the second node N2, the second terminal connected to the third node N3, and the gate connected to the first node N1. The isolation circuit 2 may include an eighth transistor T8. The eighth transistor T8 has the first terminal connected to the first node N1, the second terminal connected to the fourth node N4, and the gate connected to the first gate driving signal terminal G1. The compensation circuit 3 may include a second transistor T2. The second transistor T2 has the first terminal connected to the fourth node N4, the second terminal connected to the third node N3, and the gate connected to the second gate driving signal terminal G2. The first reset circuit 4 may include a first transistor T1. The first transistor T1 has the first terminal connected to the first initial signal terminal Vinit1, the second terminal connected to the fourth node N4, and the gate connected to the first reset signal terminal Re1.

In an exemplary embodiment, as shown in FIG. 3, the eighth transistor T8 may be an N-type transistor; and the first transistor T1, the driving transistor T3, and the second transistor T2 may be P-type transistors. The N-type eighth transistor has a smaller turn-off leakage current, so that the leakage problem at the first node N1 in the light-emitting stage can be further improved. The P-type transistors have a relatively high carrier mobility, which is beneficial for the realization of a display panel with high resolution, high response speed, high pixel density, and high aperture ratio.

Figure 4A:
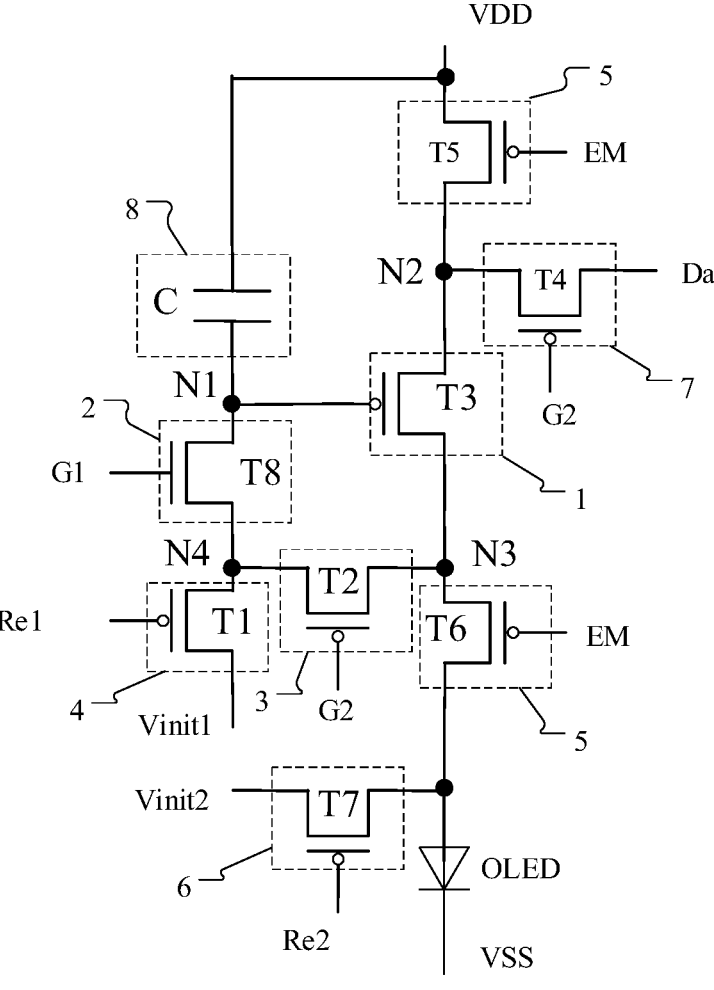
FIG. 4*a* is a schematic structural diagram of a pixel circuit according to another exemplary embodiment of the present disclosure.

In an exemplary embodiment, as shown in FIG. 4a, it is a schematic structural diagram of a pixel circuit according to another exemplary embodiment of the present disclosure. The pixel circuit is used for driving the light-emitting unit OLED to emit light. The pixel circuit may further include: a light-emission control circuit 5, a second reset circuit 6, a data writing circuit 7, and a storage circuit 8. The light-emission control circuit 5 is connected to the first power supply terminal VDD, the second node N2, the third node N3, the first electrode of the light-emitting unit OLED, and the enable signal terminal EM, for connecting the first power supply terminal VDD and the second node N2 in response to the signal at the enable signal terminal EM, and connecting the third node N3 and the first electrode of the light-emitting unit OLED in response to the signal at the enable signal terminal EM. The second reset circuit 6 is connected to the first electrode of the light-emitting unit OLED, the second initial signal terminal Vinit2, and the second reset signal terminal Re2, and is used for transmitting the signal at the second initial signal terminal Vinit2 to the first electrode of the light-emitting unit OLED in response to the signal at the second reset signal terminal Re2. The data writing circuit 7 is connected to the second node N2, the data signal terminal Da, and the second gate driving signal terminal G2, for transmitting the signal at the data signal terminal Da to the second node N2 in response to the signal at the second gate driving signal terminal G2. The storage circuit 8 is connected between the first power supply terminal VDD and the first node N1.

In an exemplary embodiment, the light-emission control circuit 5 may include: a fifth transistor T5 and a sixth transistor T6. The fifth transistor T5 has the first terminal connected to the first power supply terminal VDD, the second terminal connected to the second node N2, and the gate connected to the enable signal terminal EM. The sixth transistor T6 has the first terminal connected to the third node N3, the second terminal connected to the first electrode of the light-emitting unit OLED, and the gate connected to the enable signal terminal EM. The second reset circuit 6 may include a seventh transistor T7. The seventh transistor T7 has the first terminal connected to the second initial signal terminal Vinit2, the second terminal connected to the first electrode of the light-emitting unit OLED, and the gate connected to the second reset signal terminal Re2. The data writing circuit 7 may include a fourth transistor T4. The fourth transistor T4 has the first terminal connected to the data signal terminal Da, the second terminal connected to the second node N2, and the gate connected to the second gate driving signal terminal G2. The storage circuit 8 may include a capacitor C connected between the first power supply terminal VDD and the first node N1. The fourth transistor T4, the fifth transistor T5, the sixth transistor T6, and the seventh transistor T7 may all be P-type transistors.

In an exemplary embodiment, the first power supply terminal VDD may be a high-level power supply terminal, and the second power supply terminal VSS may be a low-level power supply terminal.

Figure 4B:
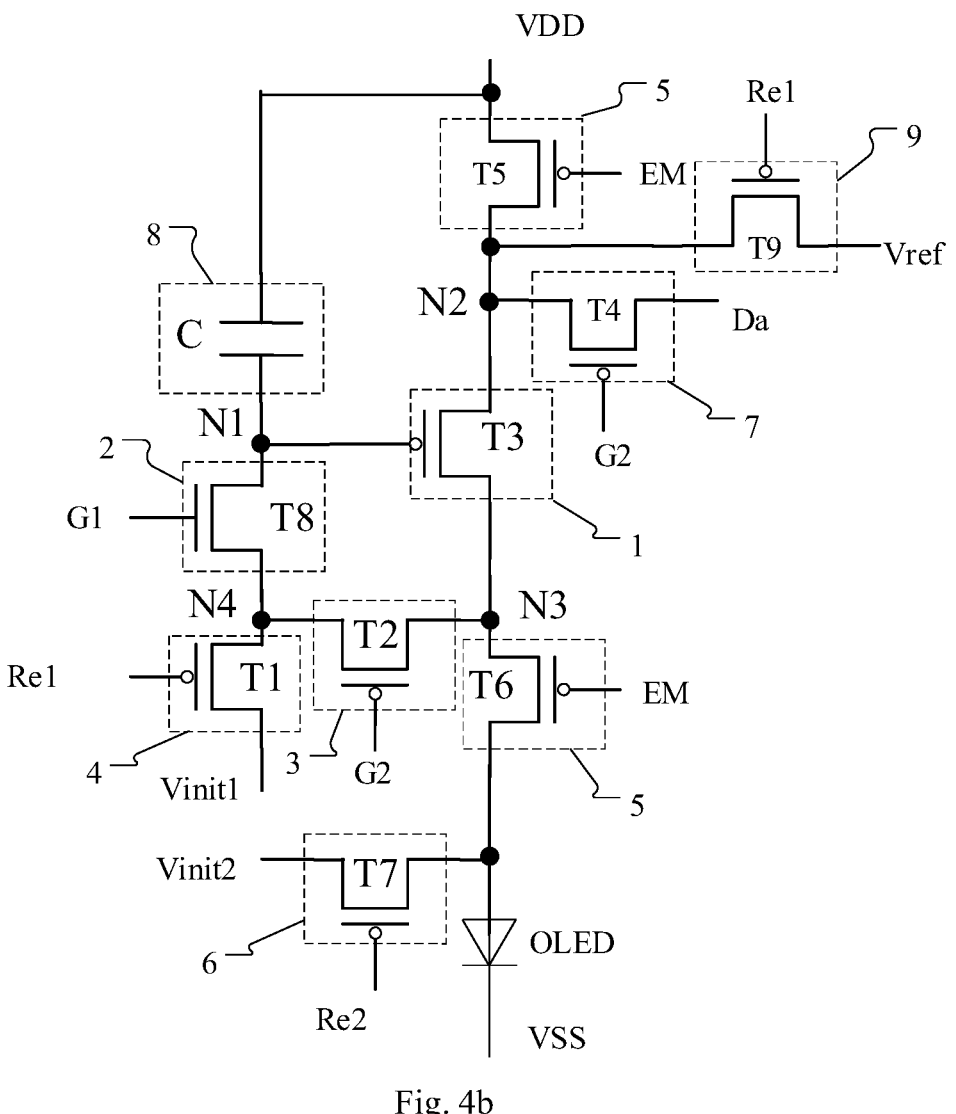
FIG. 4*b* is a schematic structural diagram of a pixel circuit according to another exemplary embodiment of the present disclosure.

As shown in FIG. 4*b*, it is a schematic structural diagram of a pixel circuit according to another exemplary embodiment of the present disclosure. The pixel circuit may further include a third reset circuit 9. The third reset circuit 9 may be connected to the second node N2, the first reset signal terminal Re1, and the reference signal terminal Vref. The third reset circuit 9 is used for transmitting the signal at the reference signal terminal Vref to the second node N2 in response to the signal at the first reset signal terminal Re1. The third reset circuit 9 may include a ninth transistor T9. The ninth transistor T9 has the first terminal connected to the reference signal terminal Vref, the second terminal connected to the second node N2, and the gate connected to the first reset signal terminal Re1. The ninth transistor T9 may be a P-type transistor.

Figure 5:
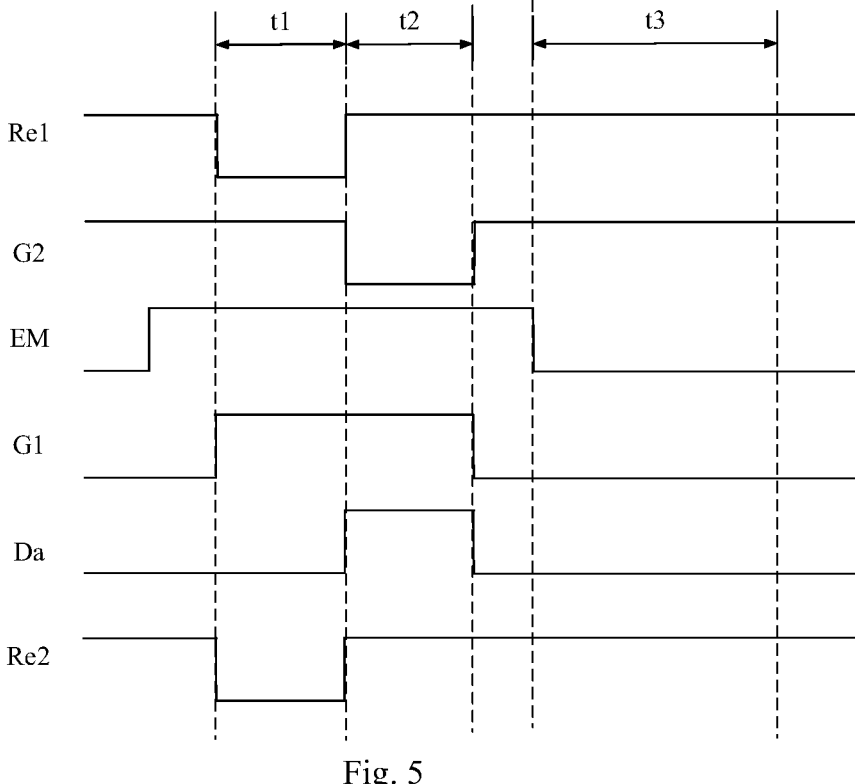
FIG. 5 is a timing diagram of each node in a driving method of the pixel circuit shown in FIG. 4*a;*

As shown in FIG. 5, it is a timing diagram of each node in a driving method of the pixel circuit shown in FIG. 4*a*. G1 indicates the timing of the first gate driving signal terminal G1, Re1 indicates the timing of the first reset signal terminal Re1, Re2 indicates the timing of the second reset signal terminal Re2, EM indicates the timing of the enable signal terminal EM, and Da indicates the timing of the data signal terminal Da. The driving method of the pixel circuit may include a reset phase t1, a compensation phase t2, and a light-emitting phase t3. In the reset phase t1: a low-level signal may be input to the first reset signal terminal Re1 and the second reset signal terminal Re2; a high-level signal may be input to the first gate driving signal terminal G1; the first transistor T1, the eighth transistor T8, and the seventh transistor T7 are turned on; the first initial signal terminal Vinit1 inputs an initial signal to the first node N1; and the second initial signal terminal Vinit2 inputs an initial signal to the first electrode of the light-emitting unit OLED. In the compensation stage t2: a low-level signal may be input to the second gate driving signal terminal G2; a high-level signal may be input to the first gate driving signal terminal G1; the fourth transistor T4, the second transistor T2, and the eighth transistor T8 are turned on; and at the same time, the data signal terminal Da outputs a data signal for writing a voltage Vdata+Vth to the first node N1. Vdata is the voltage at the data signal, and Vth is the threshold voltage of the driving transistor T3. In the light-emitting phase t3: a low-level signal is input to the enable signal terminal EM; the sixth transistor T6 and the fifth transistor T5 are turned on; and the driving transistor T3 emits light under the effect of the voltage Vdata+Vth at the first node N1. The formula about the driving transistor's output current is $I=(\mu WCox/2L)(Vgs-Vth)^2$, where $\mu$ is the carrier mobility, Cox is the gate capacitance per unit area, W is the width of the driving transistor channel, and L is the length of the driving transistor channel, Vgs is the gate-source voltage difference of the driving transistor, and Vth is the threshold voltage of the driving transistor. The output current I of the driving transistor in the pixel circuit is $(\mu WCox/2L)(Vdata+Vth-Vdd-Vth)^2$. The pixel circuit can avoid the influence of the threshold value of the driving transistor on its output current.

It should be understood that, in other exemplary embodiments, the pixel circuit may also have other driving methods. For example, the pixel circuit may also input a high-level signal to the second reset signal terminal in the reset phase, and input a high-level signal to the second reset signal terminal in the compensation phase. That is, the first electrode of the light-emitting unit OLED may be reset in the compensation phase.

The timing of each node in the driving process of the pixel circuit shown in FIG. 4*b* is also shown in FIG. 5. For the pixel circuit shown in FIG. 4*b*, the second node N2 may be reset through the reference signal terminal Vref in the reset phase t1, so that before the compensation stage t2, the gate-source voltage difference of the driving transistor T3 is the same, thereby eliminating the threshold drift of the driving transistor caused by hysteresis.

Figure 6:
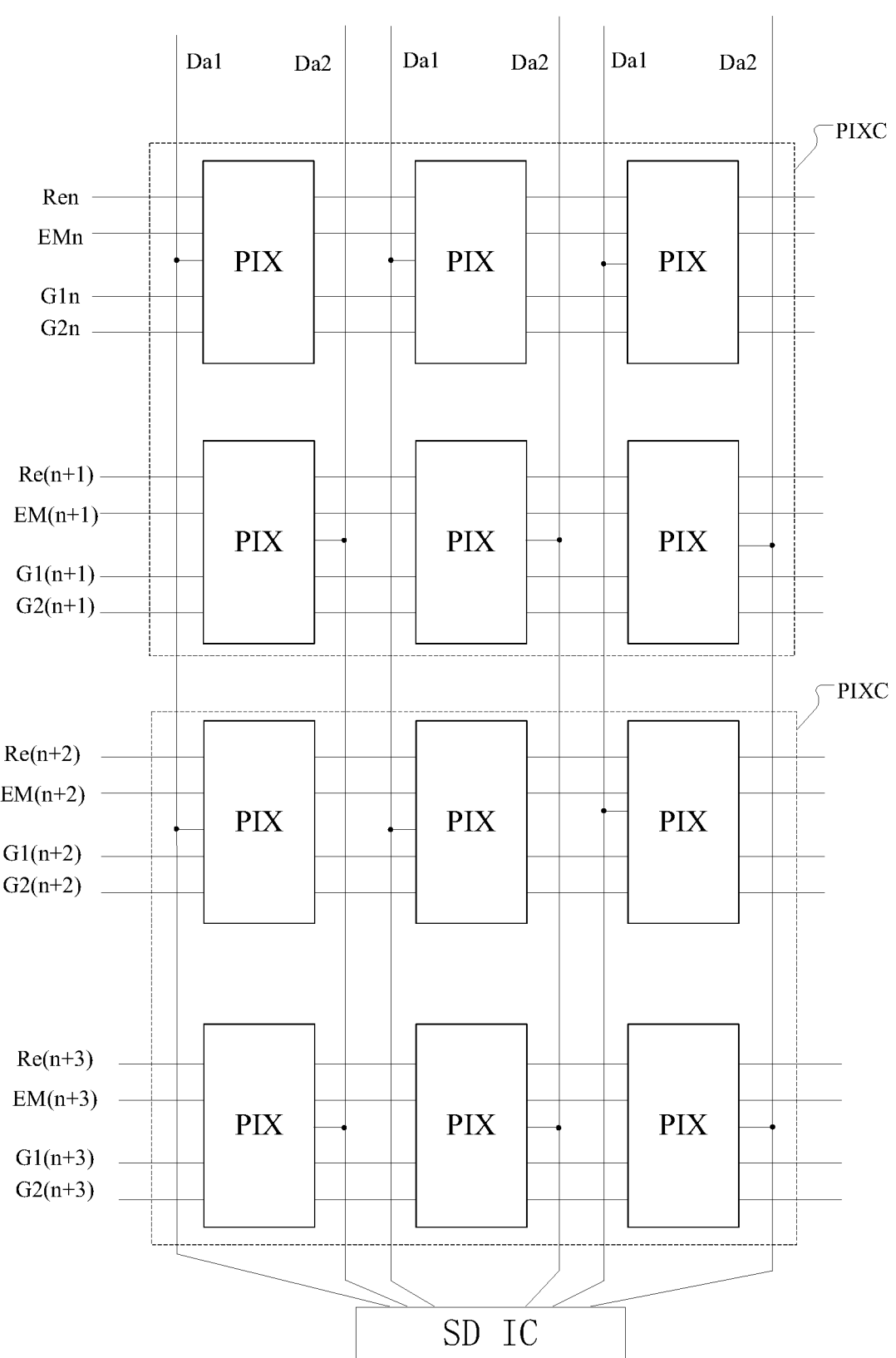
FIG. 6 is a schematic structural diagram of a display panel according to an exemplary embodiment of the present disclosure.

An exemplary embodiment further provides a display panel, which may include a plurality of the above-mentioned pixel circuits. The plurality of pixel circuits may be arranged in an array along the row and column directions. As shown in FIG. 6, it is a schematic structural diagram of a display panel according to an exemplary embodiment of the present disclosure. The display panel may further include: a plurality of first data lines Da1 and a plurality of second data lines Da2. Each column of pixel circuits is provided with a respective first data line Da1. The first data line Da1 is connected to the data signal terminal of a respective odd row of pixel circuits. Each column of pixel circuits is provided with a respective second data line Da1. The second data line Da2 is connected to the data signal terminal of a respective even row of pixel circuits. The plurality of first data lines Da1 and the plurality of second data lines Da2 may be respectively connected to the source driving circuit SD IC. The source driving circuit SD IC may provide data signals to the plurality of first data lines Da1 and the plurality of second data lines Da2 respectively.

As shown in FIG. 6, the display panel further includes: a plurality of first gate lines G1$n$, G1($n$+1), G1($n$+2), G1($n$+3); a plurality of second gate lines G2$n$, G2($n$+1), G2($n$+2), G2($n$+3); a plurality of enable signal lines EMn, EM(n+1), EM(n+2), EM(n+3); and a plurality of reset signal lines Ren, Re(n+1), Re(n+2), Re(n+3). Each row of pixel circuits is provided with a respective one of the first gate lines. The first gate line is connected to the first gate driving signal terminal in the respective pixel circuit. Each row of pixel circuits is provided with a respective one of the second gate lines. The second gate line is connected to the second gate driving signal terminal in the respective pixel circuit. Each row of the pixel circuit is provided with a respective enable signal line. The enable signal line is connected to the enable signal terminal in the respective pixel circuit. Each row of pixel circuits is provided with a respective reset signal line. The reset signal line is connected to the first reset signal terminal in the pixel circuit of a row and the second reset signal terminal in the pixel circuit of a previous row. It should be noted that the exemplary embodiment is only described by taking 4 rows of pixel circuits as an example, and the display panel may also include other rows of pixel circuits.

Figure 7A:
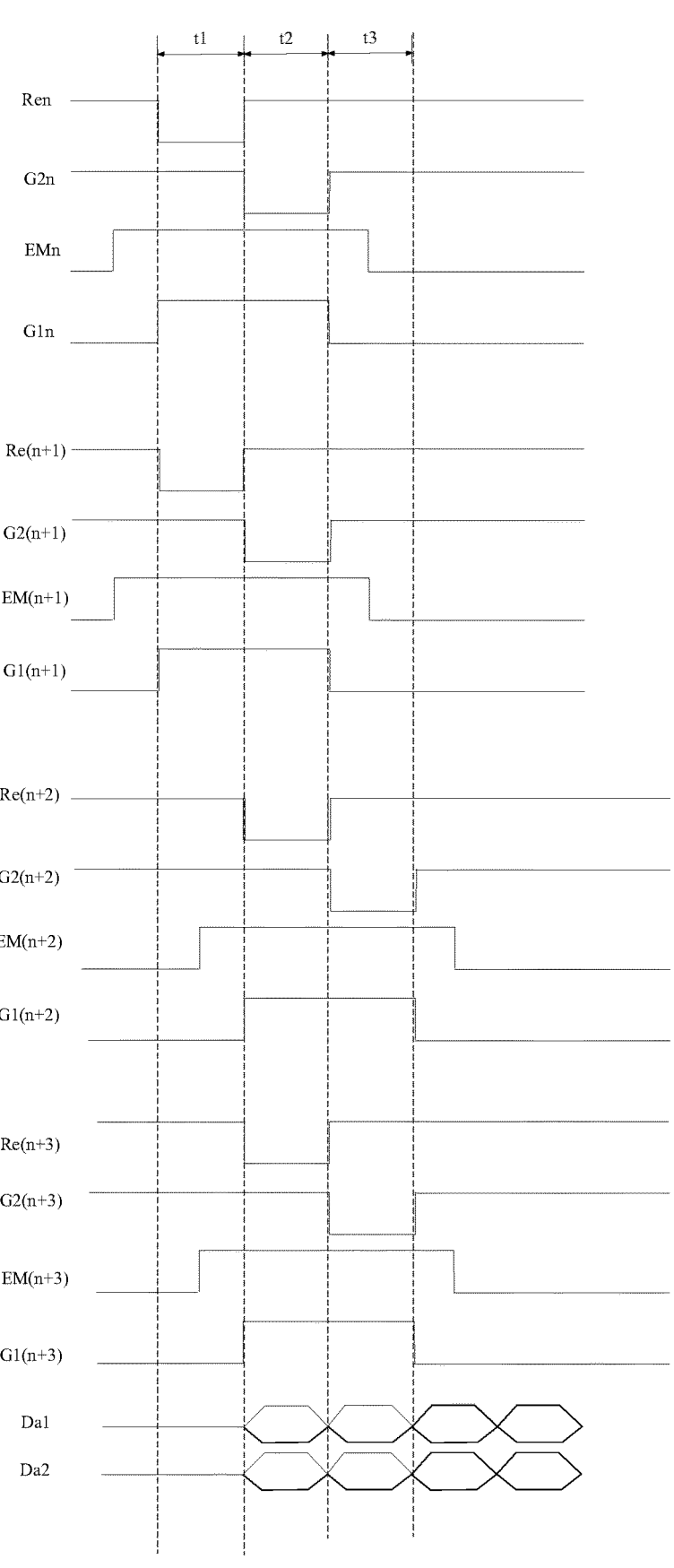
FIG. 7*a* is a timing diagram of each signal line in a driving method of the display panel shown in FIG. 6.
Figure 7B:
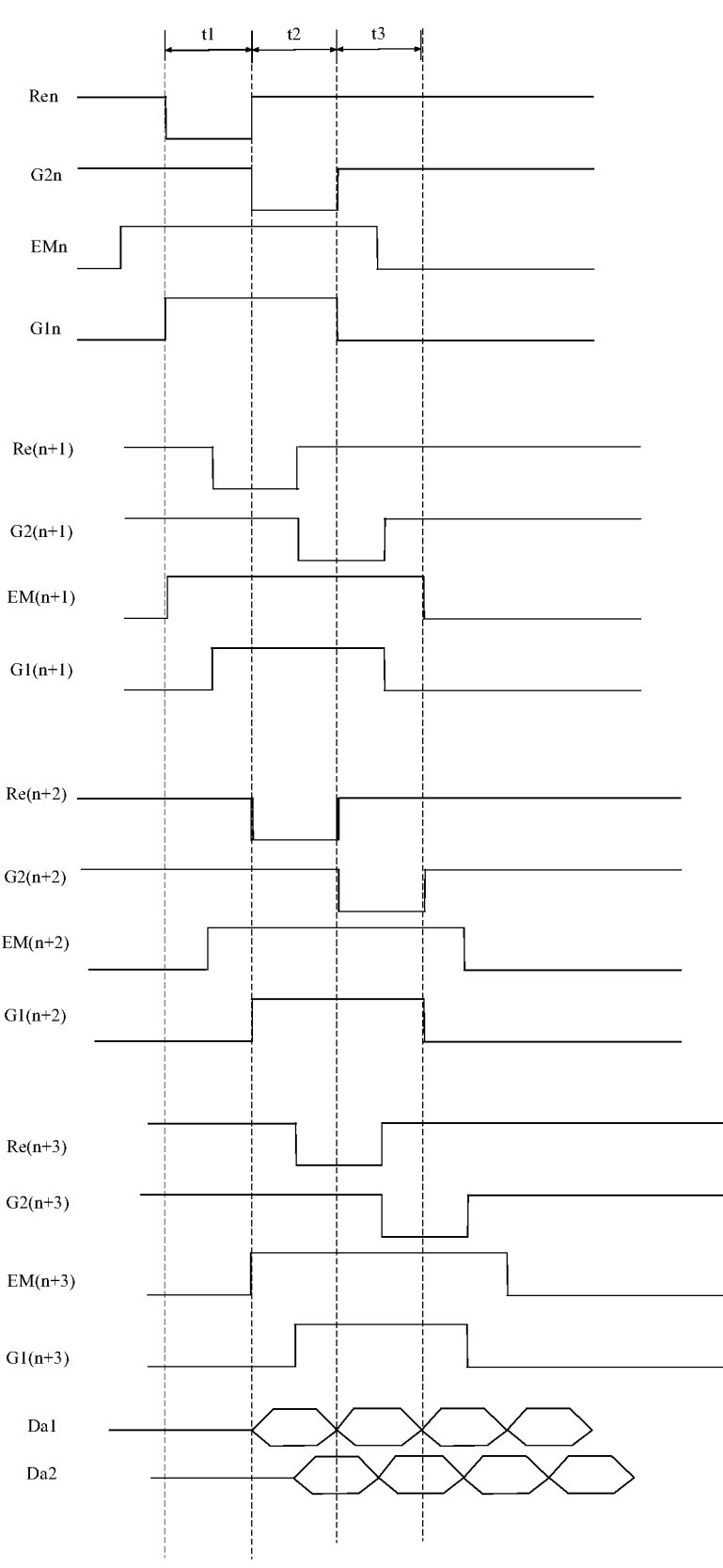
FIG. 7*b* is a timing diagram of each signal line in another driving method of the display panel shown in FIG. 6.

As shown in FIG. 7$a$, it is a timing diagram of each signal line in a driving method of the display panel shown in FIG. 6. G1$n$ represents the timing diagram of the first gate line G1$n$, G1($n$+1) represents the timing diagram of the first gate line G1($n$+1), G1($n$+2) represents the timing diagram of the first gate line G1($n$+2), G1($n$+3) represents the timing diagram of the first gate line G1($n$+3), G2$n$ represents the timing diagram of the second gate line G2$n$, G2($n$+1) represents the timing diagram of the second gate line G2($n$+1), G2($n$+2) represents the timing diagram of the second gate line G2($n$+2), G2($n$+3) represents the timing diagram of the second gate line G2($n$+3), Ren represents the timing diagram of the reset signal line Ren, Re(n+1) represents the timing diagram of the reset signal line Re(n+1), Re(n+2) represents the timing diagram of the reset signal line Re(n+2), Re(n+3) represents the timing diagram of the reset signal line Re(n+3), EMn represents the timing diagram of the enable signal line EMn, EM(n+1) represents the timing diagram of the enable signal line EM(n+1), EM(n+2) represents the timing diagram of the enable signal line EM(n+2), EM(n+3) represents the timing diagram of the enable signal line EM(n+3), Da1 represents the timing diagram of any first data line Da1, and Da2 represents the timing diagram of any second data line Da2. The period t1 is the reset phase of the pixel circuit corresponding to the first gate line G1$n$ and the first gate line G1($n$+1). The period t2 is the compensation phase of the pixel circuit corresponding to the first gate line G1$n$ and the first gate line G1($n$+1), and the reset phase of the pixel circuit corresponding to the first gate line G1($n$+2) and the first gate line G1($n$+3). The period t3 is the compensation stage of the pixel circuit corresponding to the first gate line G1($n$+2) and the first gate line G1($n$+3).

As shown in FIGS. 6 and 7$a$, a plurality of pixel circuits are grouped into a plurality of pixel circuit groups PIXC, and each pixel circuit group PIXC includes two adjacent rows of pixel circuits. In the same pixel circuit group PIXC, the timings of the signals at the two first gate lines are the same, the timings of the signals at the two second gate lines are the same, the timings of the signals at the two enable signal lines are the same, and the timing of the signals at the two reset signal lines are the same. This setting helps to enable the display panel to sequentially scan the pixel circuit groups, and at the same time, during the scanning period of the pixel circuit group, data signals are provided to the pixel circuits in the pixel circuit group through the first data line and the second data line. Therefore, the display panel can have a higher refresh rate, or durations of the reset phase and the compensation phase in the driving period of the pixel circuit can be increased under the condition that the refresh rate remains unchanged.

As shown in FIG. 7$b$, it is a timing diagram of each signal line in another driving method of the display panel shown in FIG. 6. G1$n$ represents the timing diagram of the first gate line G1$n$, G1($n$+1) represents the timing diagram of the first gate line G1($n$+1), G1($n$+2) represents the timing diagram of the first gate line G1($n$+2), G1($n$+3) represents the timing diagram of the first gate line G1($n$+3), G2$n$ represents the timing diagram of the second gate line G2$n$, G2($n$+1) represents the timing diagram of the second gate line G2($n$+1), G2($n$+2) represents the timing diagram of the second gate line G2($n$+2), G2($n$+3) represents the timing diagram of the second gate line G2($n$+3), Ren represents the timing diagram of the reset signal line Ren, Re(n+1) represents the timing diagram of the reset signal line Re(n+1), Re(n+2) represents the timing diagram of the reset signal line Re(n+2), Re(n+3) represents the timing diagram of the reset signal line Re(n+3), EMn represents the timing diagram of the enable signal line EMn, EM(n+1) represents the timing diagram of the enable signal line EM(n+1), EM(n+2) represents the timing diagram of the enable signal line EM(n+2), EM(n+3) represents the timing diagram of the enable signal line EM(n+3), Da1 represents the timing diagram of any first data line Da1, and Da2 represents the timing diagram of any second data line Da2. The durations of period t1, period t2, and period t3 may all be 2T. The timing of the reset signal line in a row may be later by a time length of T than the timing of the reset signal line in a previous row. The timing of the enable signal line in a row may later by a time length of T than the timing of the enable signal line in a previous row. The timing of the second gate line in a row may be later by a time length of T than the timing of the second gate line in a previous row. The timing of the first gate line in a row may be later by a time length of T than the timing of the first gate line in a previous row.

Figure 10:
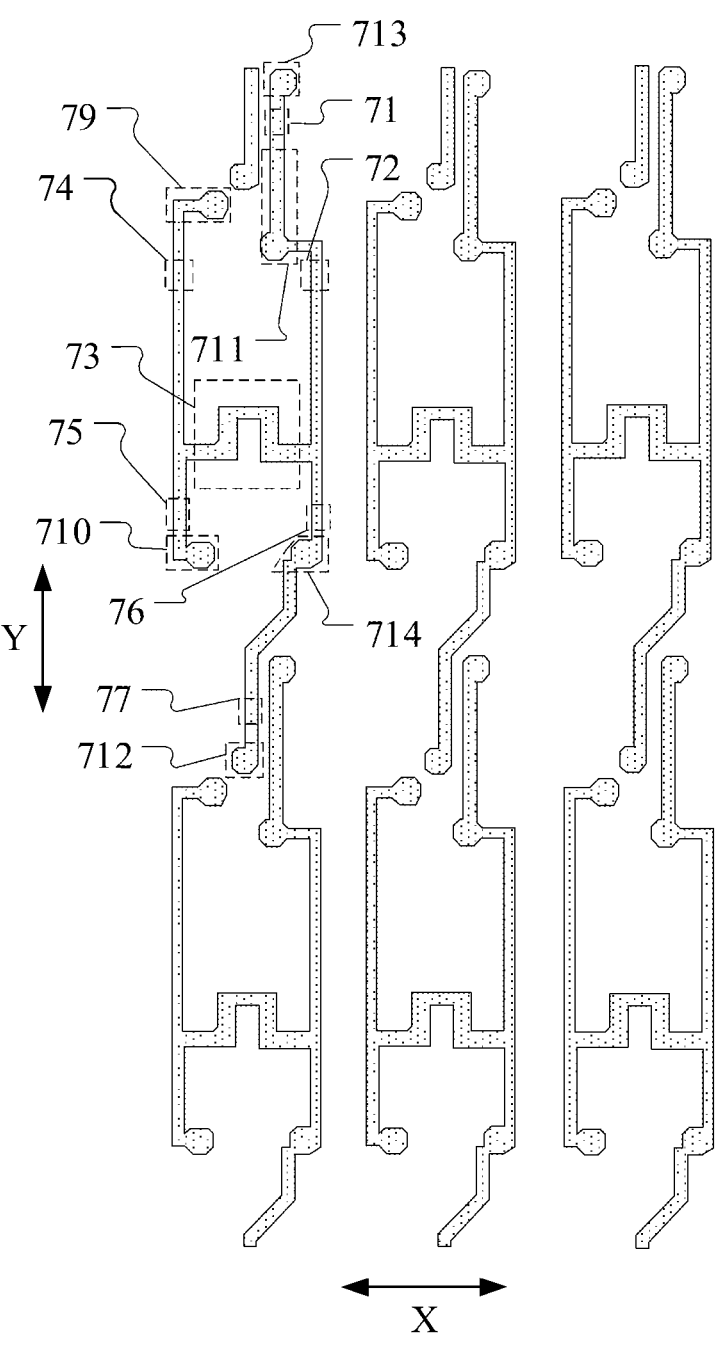
FIG. 10 is a structural layout of the first active layer in FIG. 8.
Figure 11:
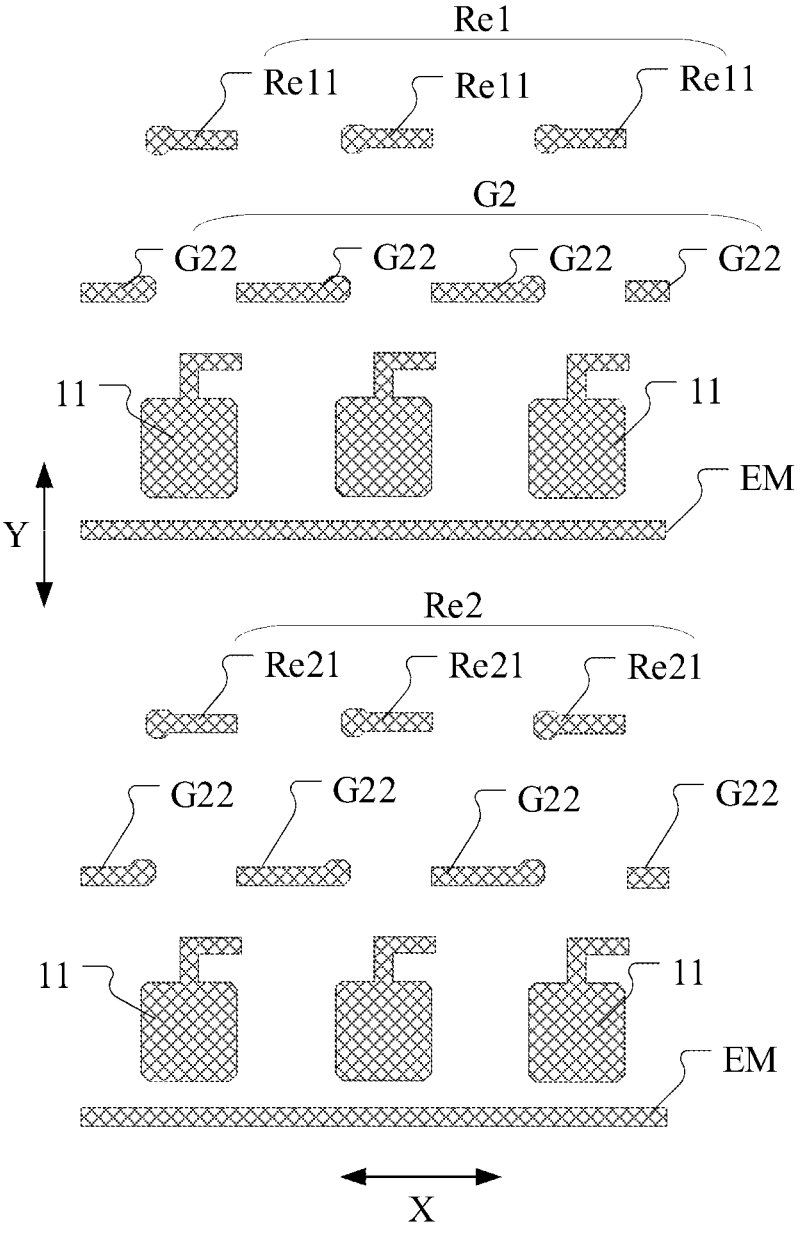
FIG. 11 is a structural layout of the first conductive layer in FIG. 8.
Figure 12:
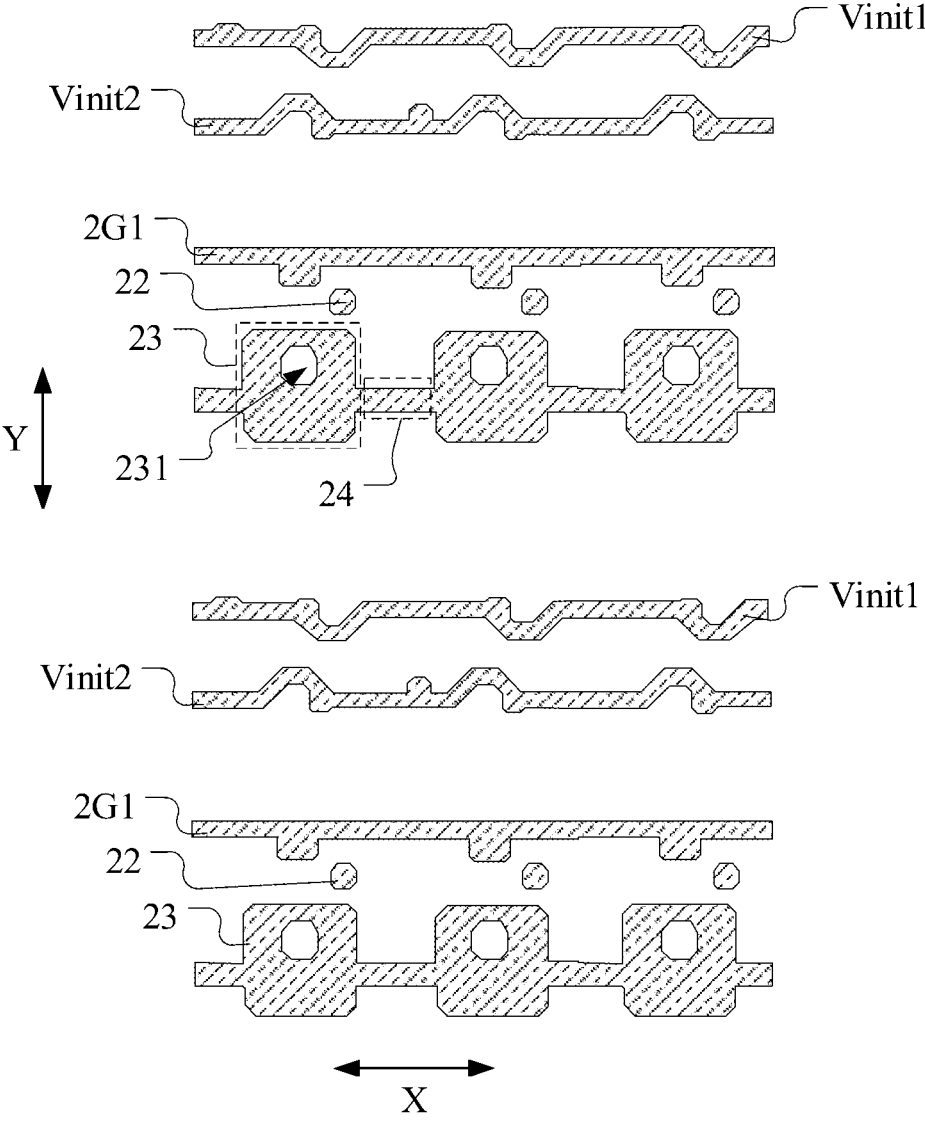
FIG. 12 is a structural layout of the second conductive layer in FIG. 8.
Figure 13:
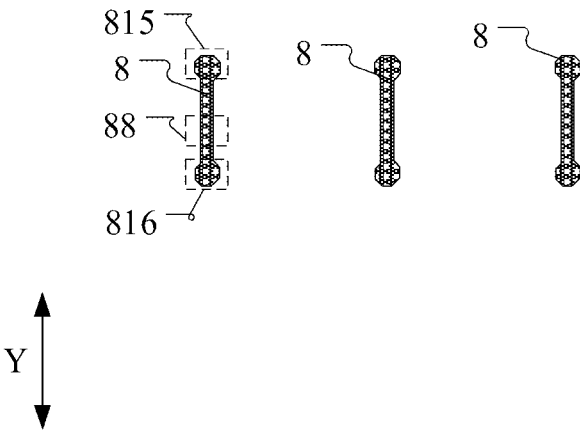
FIG. 13 is a structural layout of the second active layer in FIG. 8.
Figure 14:
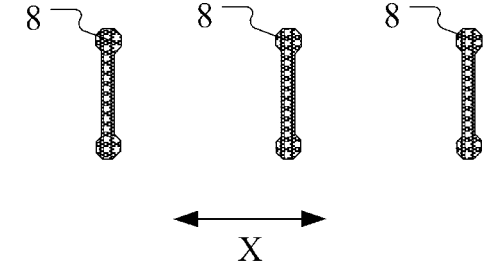
FIG. 14 is a structural layout of the third conductive layer in FIG. 8.
Figure 15:
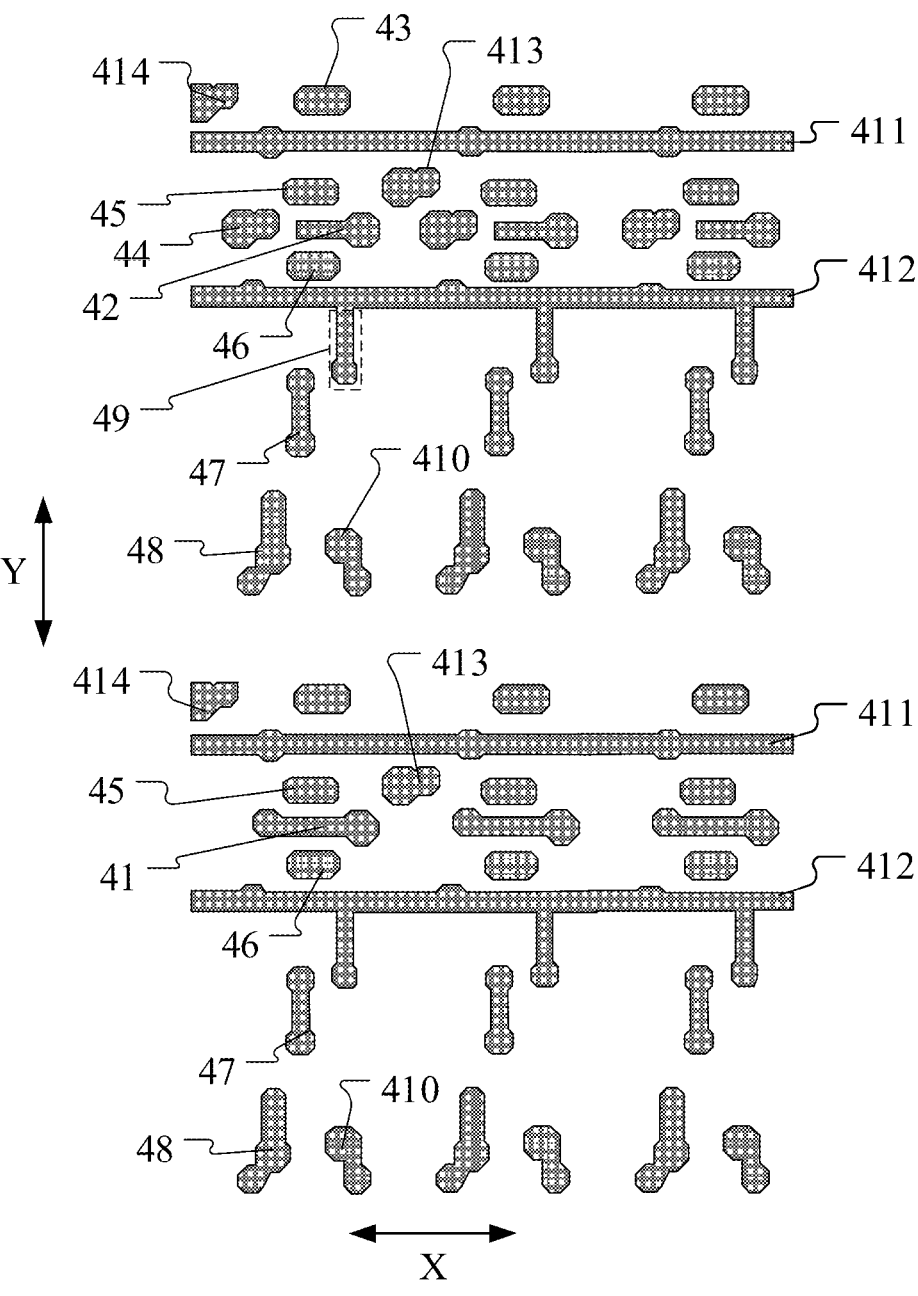
FIG. 15 is a structural layout of the fourth conductive layer in FIG. 8.
Figure 16:
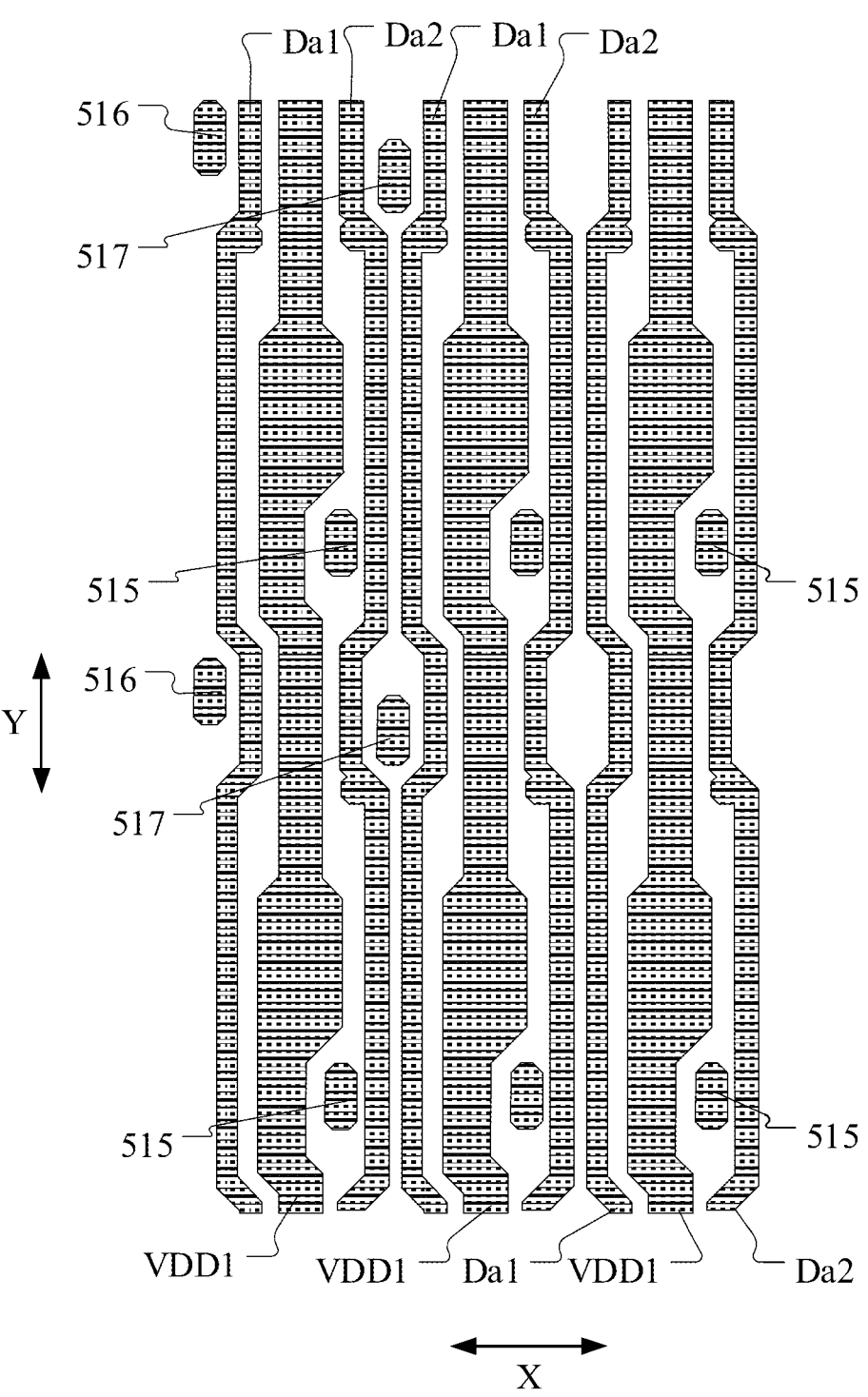
FIG. 16 is a structural layout of the fifth conductive layer in FIG. 8.
Figure 17:
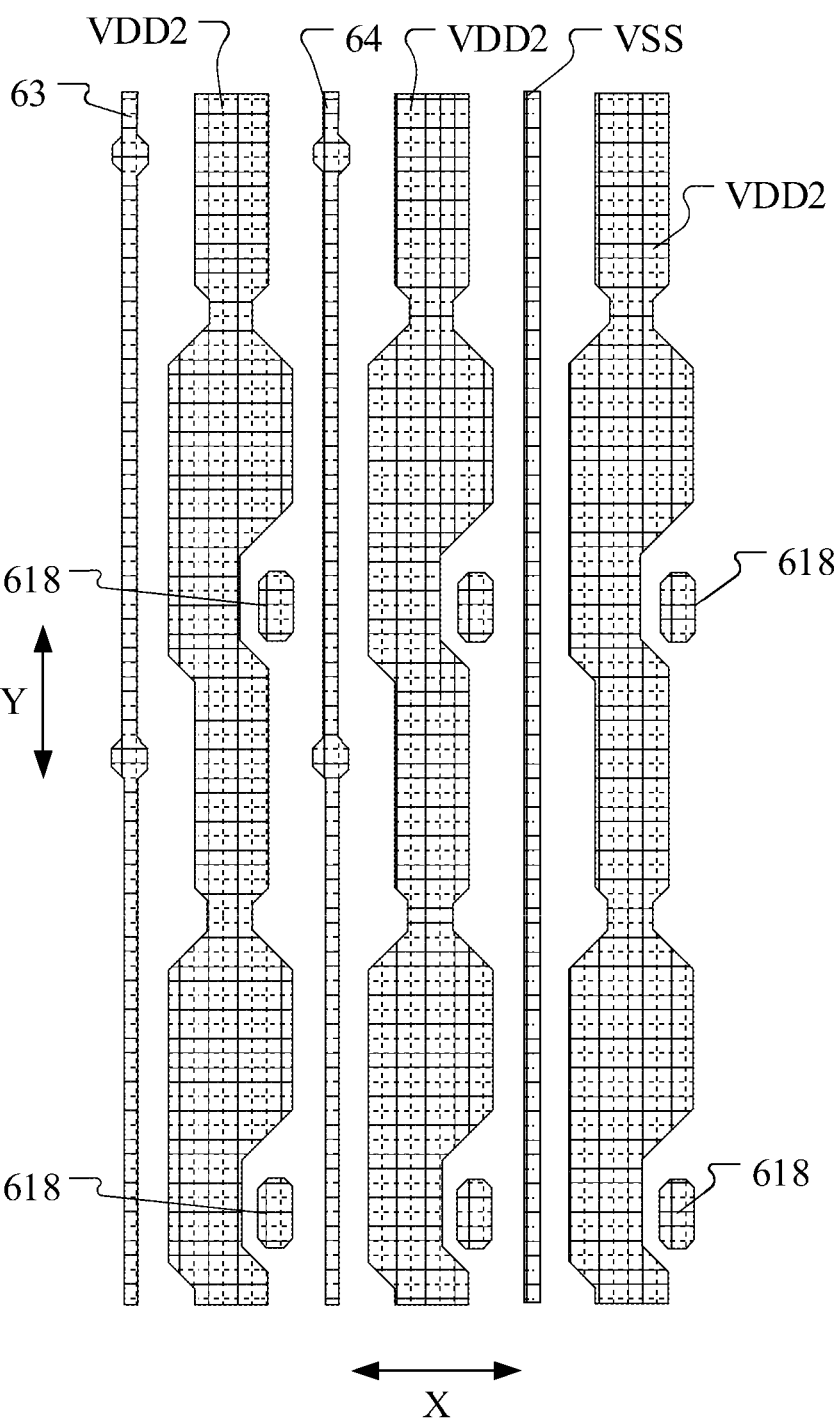
FIG. 17 is a structural layout of the sixth conductive layer in FIG. 8.
Figure 18:
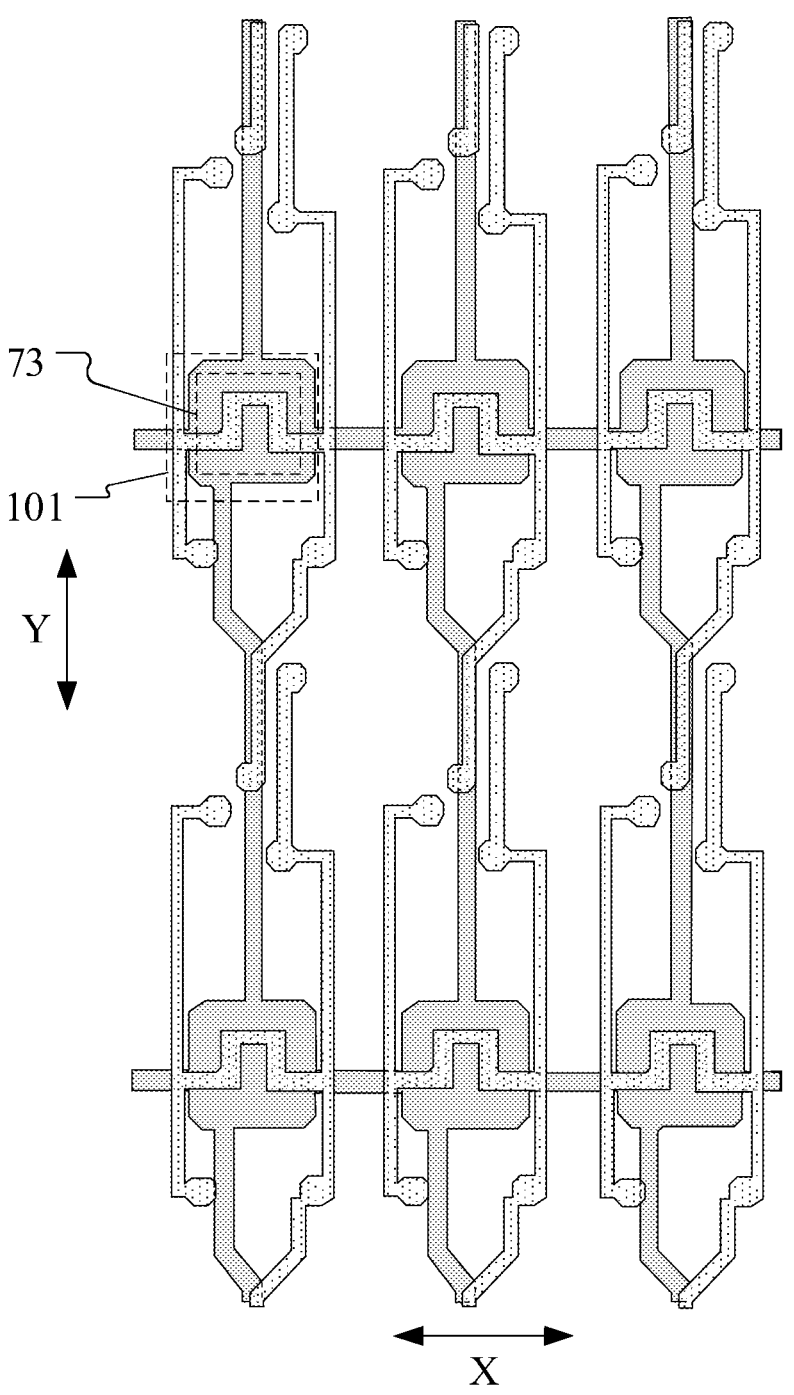
FIG. 18 is a structural layout of the light-shielding layer and the first active layer in FIG. 8.
Figure 19:
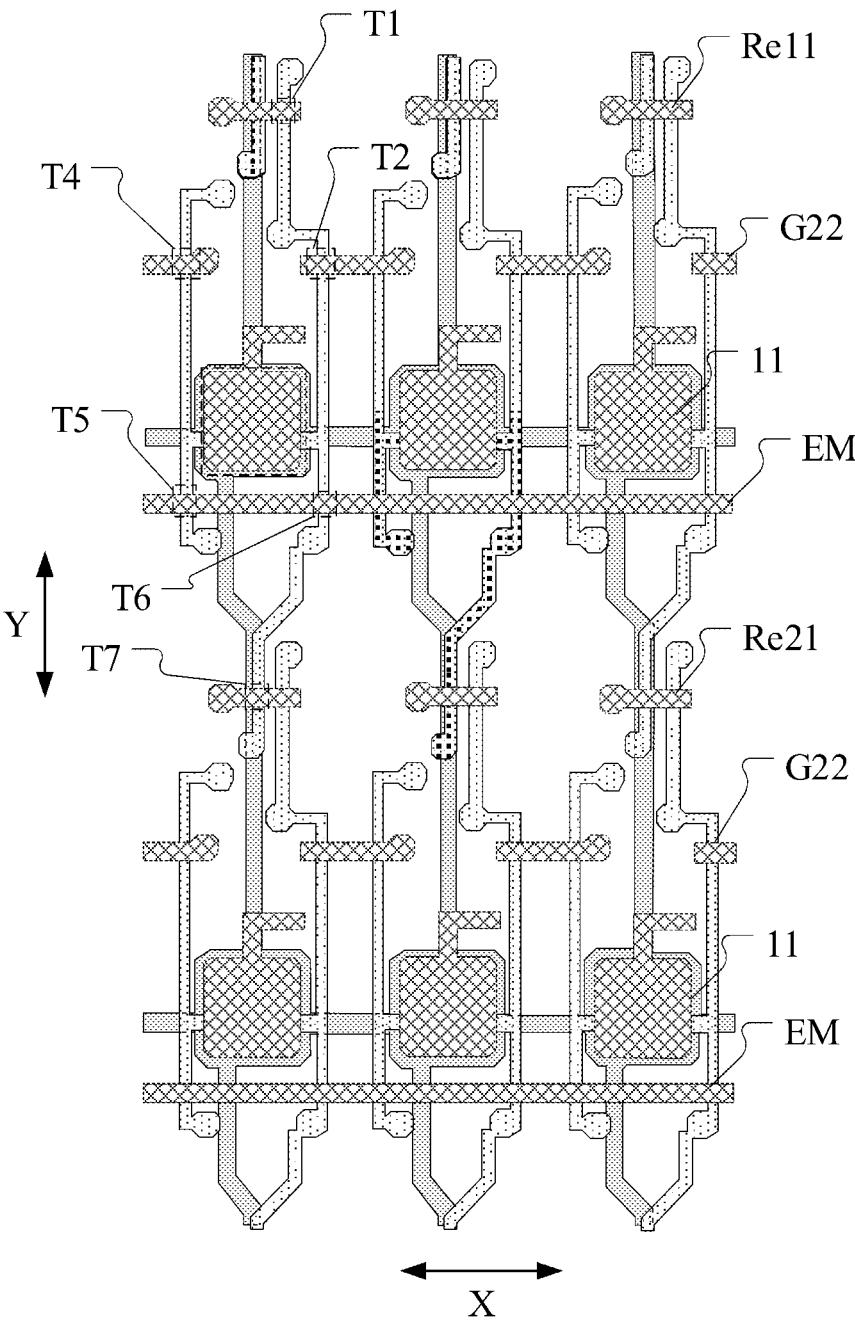
FIG. 19 is a structural layout of the light-shielding layer, the first active layer, and the first conductive layer in FIG. 8.
Figure 20:
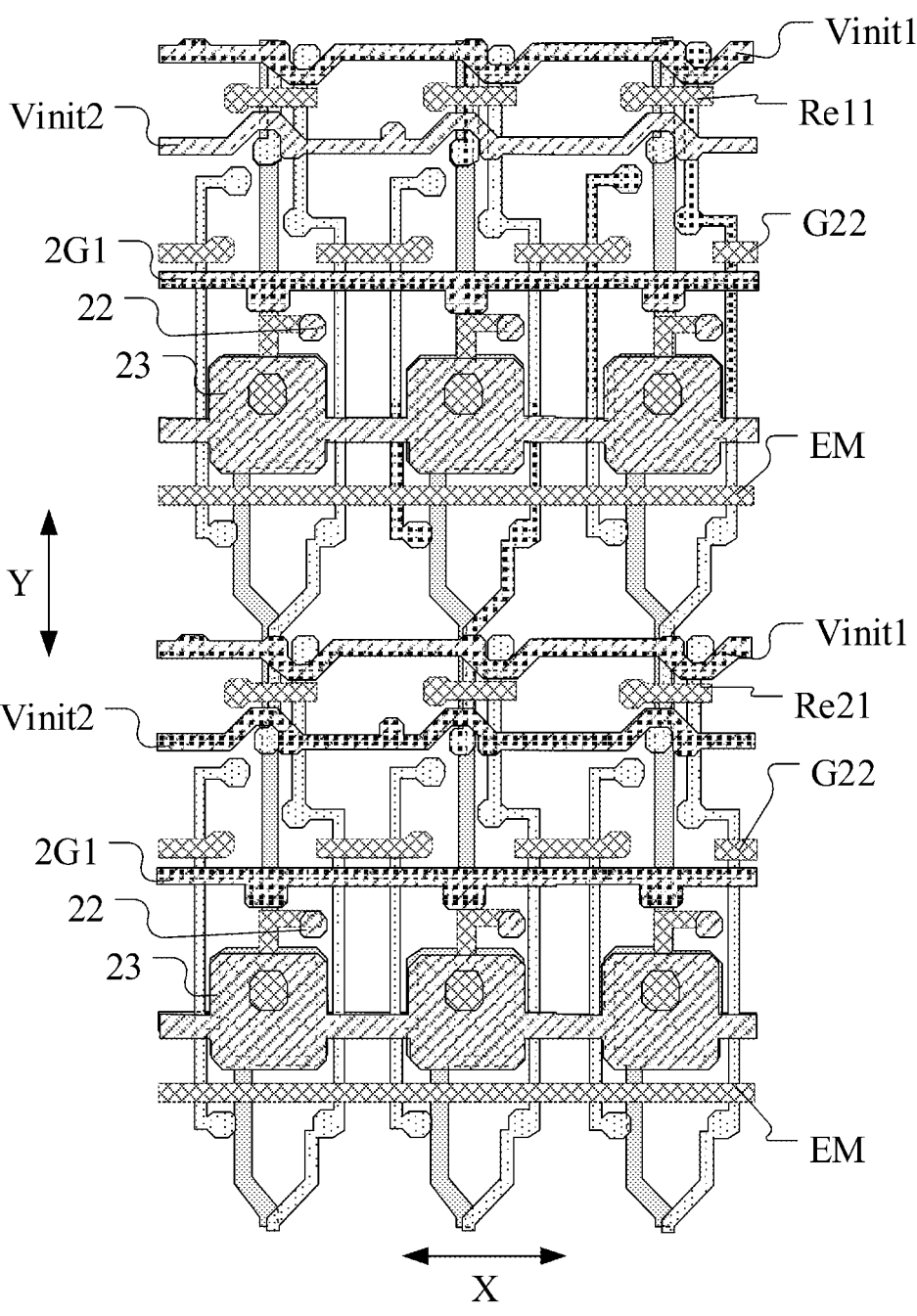
FIG. 20 is a structural layout of the light-shielding layer, the first active layer, the first conductive layer, and the second conductive layer in FIG. 8.
Figure 21:
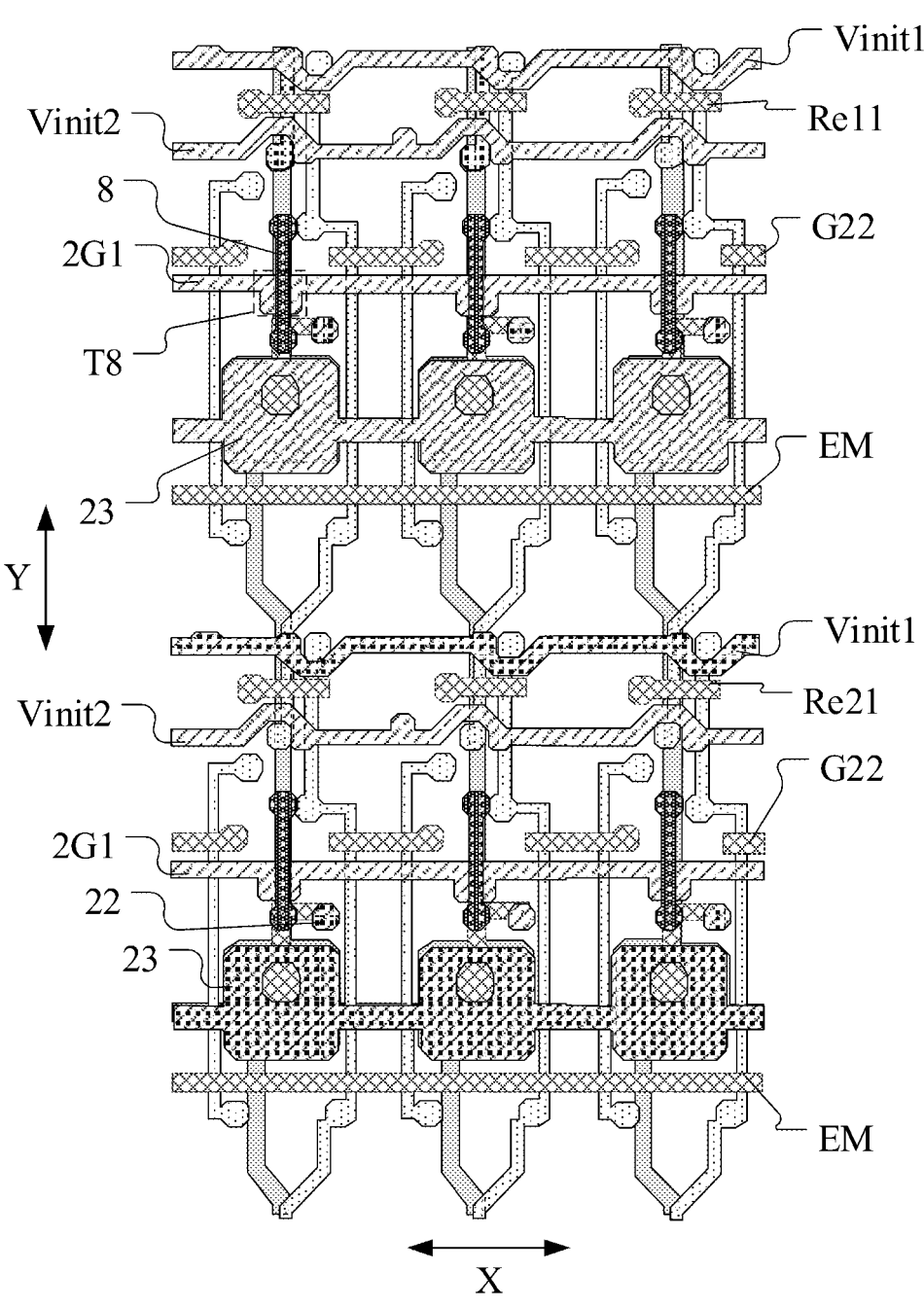
FIG. 21 is a structural layout of the light-shielding layer, the first active layer, the first conductive layer, the second conductive layer, and the second active layer in FIG. 8.
Figure 22:
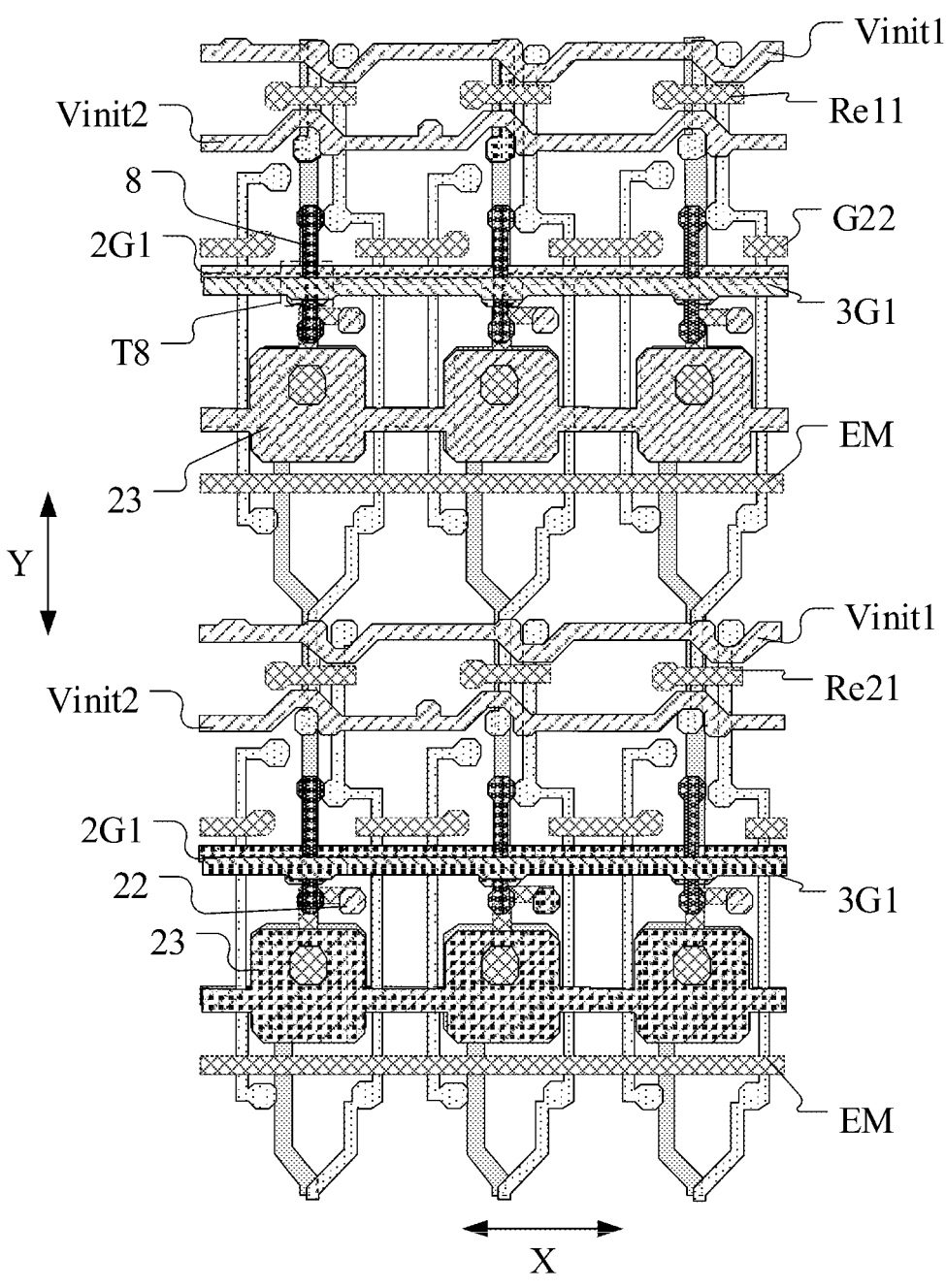
FIG. 22 is a structural layout of the light-shielding layer, the first active layer, the first conductive layer, the second conductive layer, the second active layer, and the third conductive layer in FIG. 8.
Figure 23:
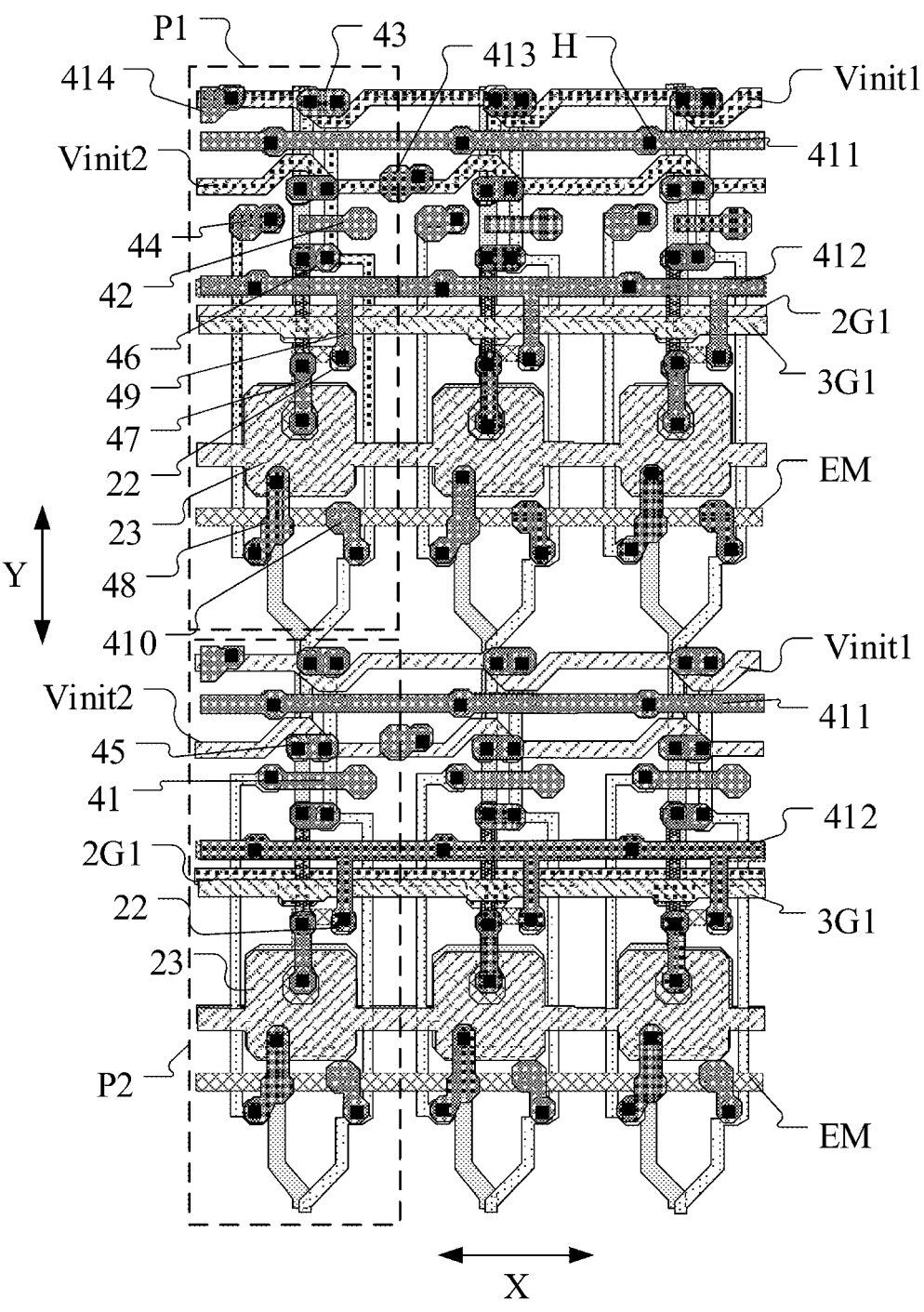
FIG. 23 is a structural layout of the light-shielding layer, the first active layer, the first conductive layer, the second conductive layer, the second active layer, the third conductive layer, and the fourth conductive layer in FIG. 8.
Figure 24:
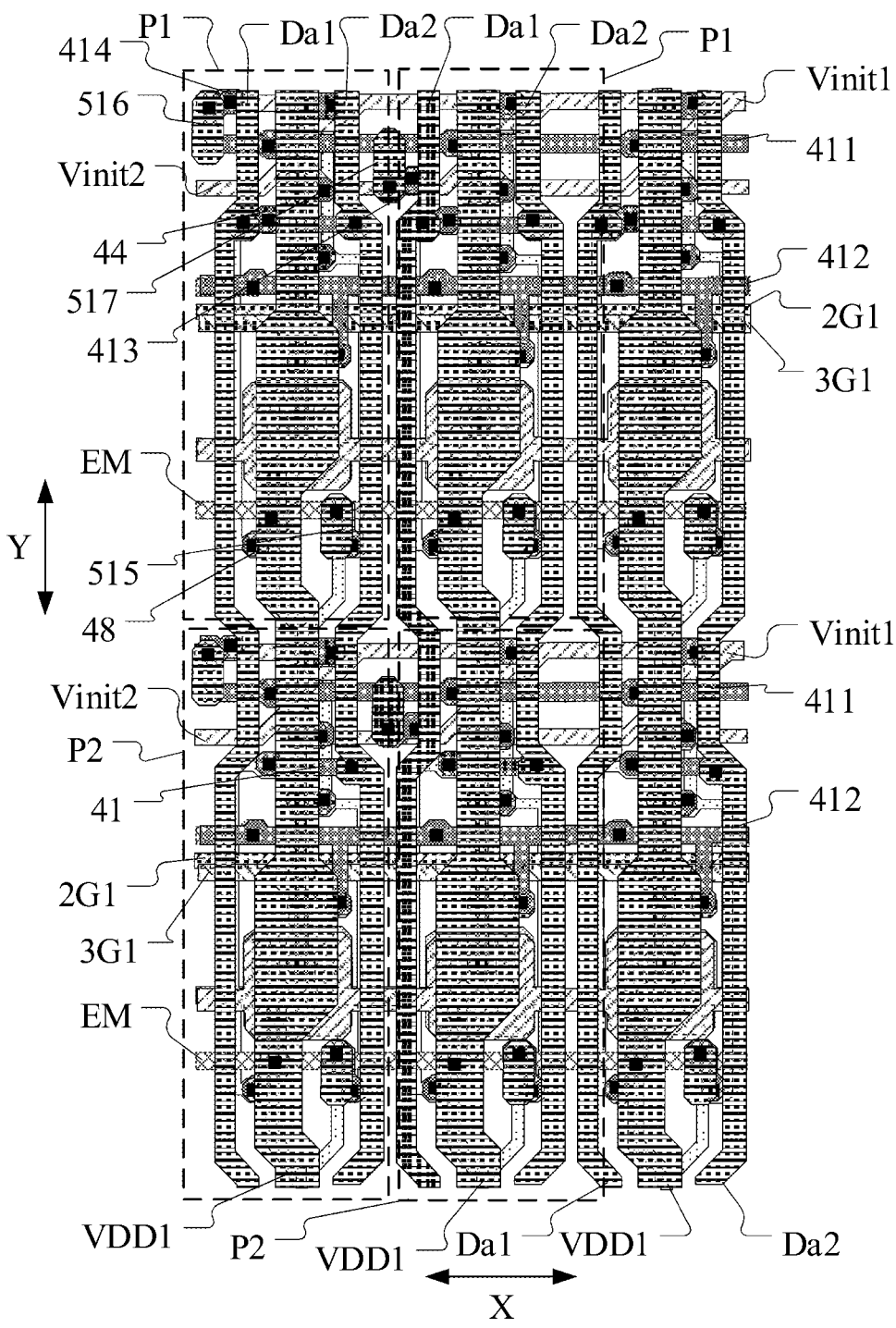
FIG. 24 is a structural layout of the light-shielding layer, the first active layer, the first conductive layer, the second conductive layer, the second active layer, the third conductive layer, the fourth conductive layer, and the fifth conductive layer in FIG. 8.

An exemplary embodiment further provides a display panel, which may include the pixel circuit shown in FIG. 4$a$. The display panel may include a base substrate, a light-shielding layer, a first active layer, a first conductive layer, a second conductive layer, a second active layer, a third conductive layer, a fourth conductive layer, a fifth conductive layer, and a sixth conductive layer that are sequentially stacked. An insulation layer may be arranged between the above-mentioned layers. As shown in FIGS. 8-24, FIG. 8 is a structural layout of a display panel according to an exemplary embodiment of the present disclosure; FIG. 9 is a structural layout of the light-shielding layer in FIG. 8; FIG. 10 is a structural layout of the first active layer in FIG. 8; FIG. 11 is a structural layout of the first conductive layer in FIG. 8; FIG. 12 is a structural layout of the second conductive layer in FIG. 8; FIG. 13 is a structural layout of the second active layer in FIG. 8; FIG. 14 is a structural layout of the third conductive layer in FIG. 8; FIG. 15 is a structural layout of the fourth conductive layer in FIG. 8; FIG. 16 is a structural layout of the fifth conductive layer in FIG. 8; FIG. 17 is a structure layout of the sixth conductive layer in FIG. 8; FIG. 18 is a structural layout of the light-shielding layer and the first active layer in FIG. 8; FIG. 19 is a structural layout of the light-shielding layer, the first active layer, and the first conductive layer in FIG. 8; FIG. 20 is a structural layout of the light-shielding layer, the first active layer, the first conductive layer, and the second conductive layer in FIG. 8; FIG. 21 is a structural layout of the light-shielding layer, the first active layer, the first conductive layer, the second conductive layer, and the second active layer in FIG. 8; FIG. 22 is a structural layout of the light-shielding layer, the first active layer, the first conductive layer, the second conductive layer, the second active layer, and the third conductive layer in FIG. 8; FIG. 23 is a structural layout of the light-shielding layer, the first active layer, the first conductive layer, the second conductive layer, the second active layer, the third conductive layer, and the fourth conductive layer in FIG. 8; and FIG. 24 is a structural layout of the light-shielding layer, the first active layer, the first conductive layer, the second conductive layer, the second active layer, the third conductive layer, the fourth conductive layer, and the fifth conductive layer.

Figure 8:
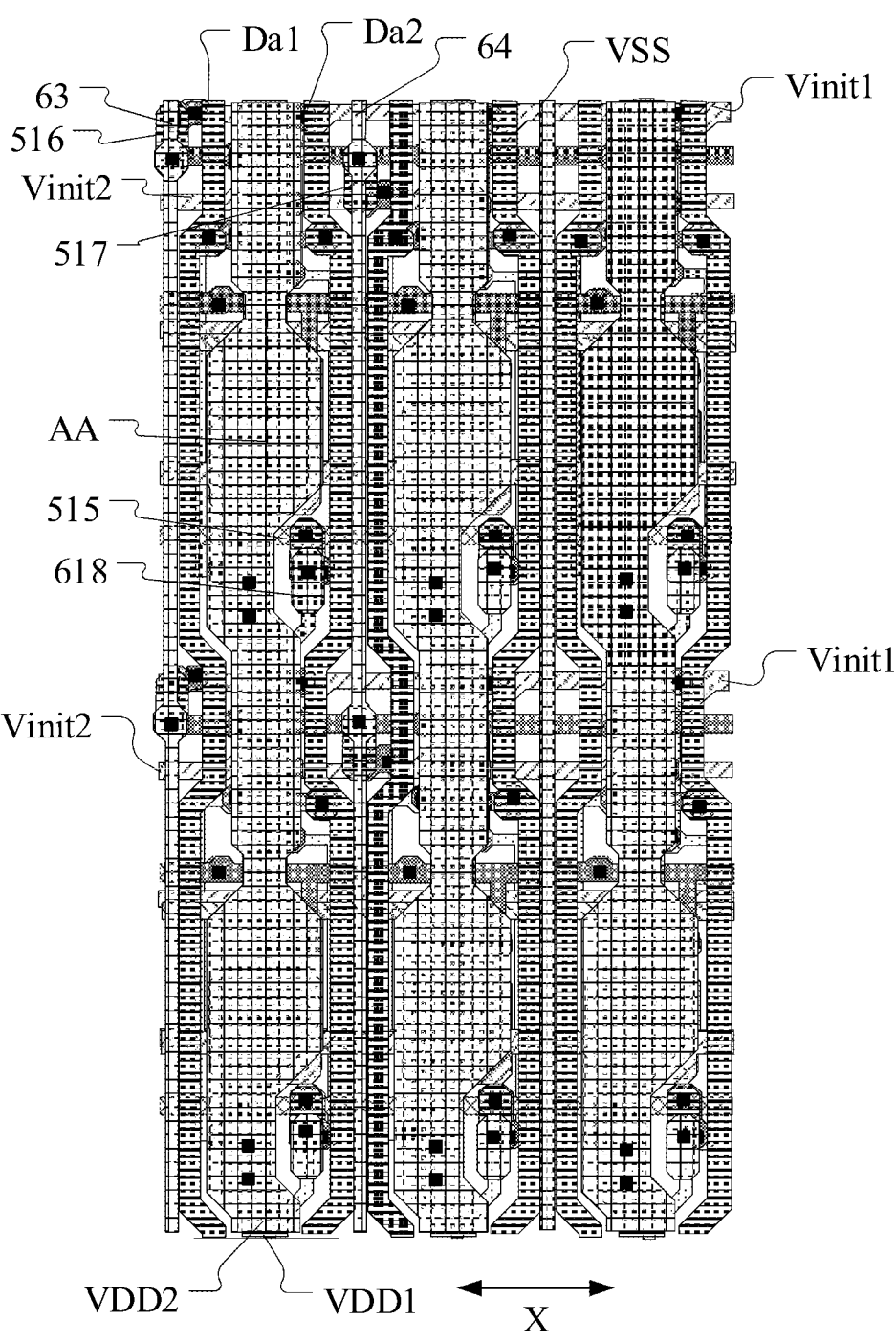
FIG. 8 is a structural layout of a display panel according to an exemplary embodiment of the present disclosure.
Figure 9:
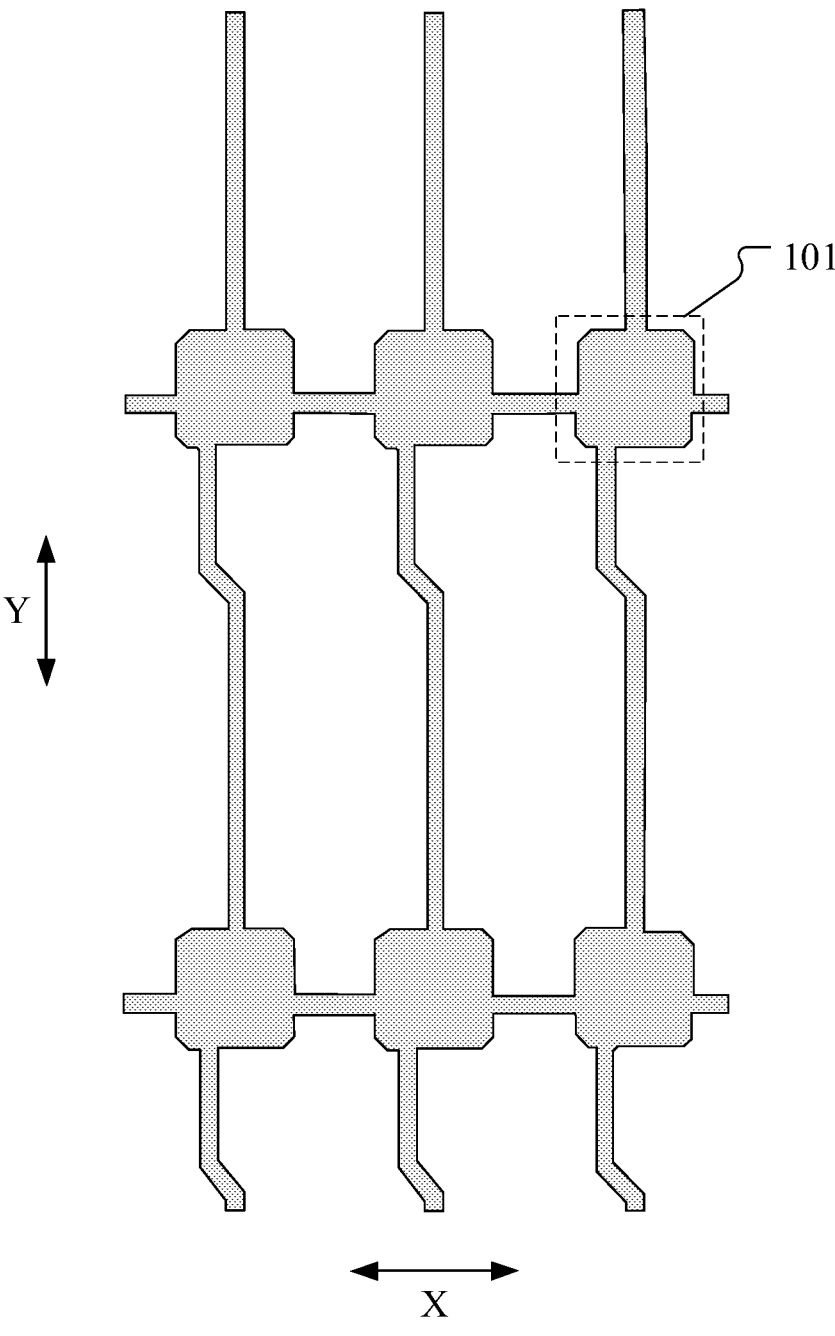
FIG. 9 is a structural layout of the light-shielding layer in FIG. 8.

As shown in FIG. 8, FIG. 9, and FIG. 18, the light-shielding layer may include a plurality of light-shielding portions 101 arranged in the first direction X and the second direction Y, and adjacent light-shielding portions 101 may be connected to each other. The light-shielding layer may be a conductive structure. For example, the light-shielding layer may be a light-shielding metal layer. The first direction X and the second direction Y may intersect with each other. For example, the first direction X may be a row direction, and the second direction Y may be a column direction.

As shown in FIG. 8, FIG. 10, and FIG. 18, the first active layer may include a first active portion 71, a second active portion 72, a third active portion 73, a fourth active portion 74, a fifth active portion 75, a sixth active portion 76, a seventh active portion 77, a ninth active portion 79, a tenth active portion 710, an eleventh active portion 711, a twelfth active portion 712, a thirteenth active portion 713, and a fourteenth active portion 714. The first active portion 71 may be used for forming the channel region of the first transistor T1. The second active portion 72 may be used for forming the channel region of the second transistor T2. The third active portion 73 may be used for forming the channel region of the driving transistor T3. The fourth active portion 74 may be used for forming the channel region of the fourth transistor T4. The fifth active portion 75 may be used for forming the channel region of the fifth transistor T5. The sixth active portion 75 may be used for forming the channel region of the sixth transistor T6. The seventh active portion 77 may be used for forming the channel region of the seventh transistor. The first active layer may be formed of polysilicon material. Accordingly, the first transistor T1, the second transistor T2, the driving transistor T3, the fourth transistor T4, the fifth transistor T5, the sixth transistor T6, and the seventh transistor T7 may be P-type low temperature polysilicon thin film transistor. The ninth active portion 79 may be connected to the side of the fourth active portion 74 away from the third active portion 73. The tenth active portion 710 is connected to the side of the fifth active portion 75 away from the third active portion 73. The eleventh active portion 711 is connected between the first active portion 71 and the second active portion 72. The twelfth active portion 712 is connected to the side of the seventh active portion away from the sixth active portion 76. The thirteenth active portion 713 is connected to the side of the first active portion 71 away from the second active portion 72. The fourteenth active portion 714 is connected between the seventh active portion 77 and the sixth active portion 76. As shown in FIG. 18, the orthographic projection of the light-shielding portion 101 on the base substrate may cover the orthographic projection of the third active portion 73 on the base substrate, and the light-shielding portion 101 helps to reduce the influence of light illumination on the characteristics of the driving transistor.

As shown in FIG. 8, FIG. 11, and FIG. 19, the first conductive layer may include: a first conductive portion 11, a second gate line G2, an enable signal line EM, a first reset signal line Re1, and a second reset signal line Re2. The orthographic projection of the first conductive portion 11 on the base substrate may cover the orthographic projection of the third active portion 73 on the base substrate. The first conductive portion 11 may be used to form the gate of the driving transistor T3 and the first electrode of the capacitor C. The second gate line G2 may be used to provide the second gate driving signal terminal in FIG. 4a. The orthographic projection of the second gate line G2 on the base substrate may extend along the first direction and cover the orthographic projections of the second active portion 72 and the fourth active portion 74 on the base substrate. Part of the second gate line G2 may be used to form the gate of the second transistor T2 and the gate of the fourth transistor T4 respectively. The second gate line G2 may include a plurality of second gate line segments G22. The orthographic projections of the plurality of second gate line segments G22 on the base substrate may extend along the first direction X and may be arranged at intervals along the first direction X. The first reset signal line Re1 may be used to provide the first reset signal terminal in FIG. 4a. The orthographic projection of the first reset signal line Re1 on the base substrate may extend along the first direction and cover the orthographic projection of the first active portion 71 on the base substrate. Part of the first reset signal line Re1 may be used to form the gate of the first transistor T1. The first reset signal line Re1 may include a plurality of first reset signal line segments Re11. The orthographic projections of the plurality of first reset signal line segments Re11 on the base substrate may extend along the first direction X and may be arranged at intervals along the first direction X. The second reset signal line Re2 may be used to provide the second reset signal terminal in FIG. 4a. The orthographic projection of the second reset signal line Re2 on the base substrate may extend along the first direction X and cover the orthographic projection of the seventh active portion 77 on the base substrate. Part of the second reset signal line Re2 may be used to form the gate of the seventh transistor T7. The second reset signal line Re2 may include a plurality of second reset signal line segments Re21. The orthographic projections of the plurality of second reset signal line segments Re21 on the base substrate may extend along the first direction X and may be arranged at intervals along the first direction X. The enable signal line EM may be used to provide the enable signal terminal in FIG. 4a. The orthographic projection of the enable signal line EM on the base substrate may extend along the first direction X and cover the orthographic projections of the fifth active portion 75 and the sixth active portion 76 on the base substrate. Parts of the enable signal line EM may be used to form the gate of the fifth transistor T5 and the gate of the sixth transistor respectively. In an exemplary embodiment, the first reset signal line Re1 in the pixel circuit of a row may be re-used as the second reset signal line Re2 in the pixel circuit of a previous row. This setting helps to reduce the size in the second direction Y of the pixel circuit, thereby being beneficial to improve the resolution of the display panel. The orthographic projection of the light-shielding portion 101 on the base substrate may overlap with the orthographic projection of the first conductive portion 11 on the base substrate. The light-shielding layer may be connected to a stable power supply terminal. For example, the light-shielding layer may be connected to the first power supply terminal, the first initial signal terminal, the second initial signal terminal, etc. in FIG. 4a. The light-shielding part 101 may stabilize the voltage of the first conductive portion 11, thereby reducing the voltage fluctuation at the gate of the driving transistor T3 during the light-emitting stage. In an exemplary embodiment, the orthographic projection of a certain structure on the base substrate extending along a certain direction, may be understood as the orthographic projection of this certain structure on the base substrate bending or extending linearly along this certain direction. In addition, the display panel may use the first conductive layer as a mask to perform conducting treatment on the first active layer. That is, the region covered by the first conductive layer in the first active layer may form the channel region of the transistor, and the region not covered by the first conductive layer in the first active layer forms a conductor structure.

As shown in FIG. 8, FIG. 12, and FIG. 20, the second conductive layer may include: a third gate line 2G1, a plurality of second conductive portions 22, a plurality of third conductive portions 23, a plurality of connection parts 24, and a plurality of first initial signal lines Vinit1, and a plurality of second initial signal lines Vinit2. The third gate line 2G1 may be used to provide the first gate driving signal terminal in FIG. 4a. The orthographic projection of the third gate line 2G1 on the base substrate may extend along the first direction X. The orthographic projection of the third conductive portion 23 on the base substrate may at least partially coincide with the orthographic projection of the first conductive portion 11 on the base substrate. The third conductive portion 23 may be used to form the second electrode of the capacitor C. Adjacent third conductive portions 23 in the first direction X may be connected through the connection part 24. The orthographic projection of the second conductive portion 22 on the base substrate may overlap with the orthographic projection of the first conductive portion 11 on the base substrate. Both the orthographic projection of the first initial signal line Vinit1 on the base substrate and the orthographic projection of the second initial signal line Vinit2 on the base substrate may extend along the first direction X. The first initial signal line Vinit1 may be used to provide the first initial signal terminal in FIG. 4a. The second initial signal line Vinit2 may be used to provide the second initial signal terminal in FIG. 4a.

As shown in FIG. 8, FIG. 13 and FIG. 21, the second active layer may include active portions 8 which are arranged independently of each other. The active portion 81 may include an eighth active portion 88, as well as a fifteenth active portion 815 and a sixteenth active portion 816 connected to two sides of the eighth active portion 88. The eighth active portion 88 may be used to form the channel region of the eighth transistor. The orthographic projection of the third gate line 2G1 on the base substrate may cover the orthographic projection of the eighth active portion 88 on the base substrate. Part of the third gate line 2G1 may be used to form the bottom gate of the eighth transistor. The second active layer may be formed of Indium Gallium Zinc Oxide. Accordingly, the eighth transistor T8 may be an N-type metal oxide thin film transistor.

As shown in FIG. 8, FIG. 14, and FIG. 22, the third conductive layer may include a first gate line 3G1. The orthographic projection of the first gate line 3G1 on the base substrate may extend along the first direction X. The first gate line 3G1 may be used to provide the first gate driving signal terminal in FIG. 4a. The orthographic projection of the first gate line 3G1 on the base substrate may cover the orthographic projection of the eighth active portion 88 on the base substrate. Part of the first gate line 3G1 may be used to form the top gate of the eighth transistor T8. The first gate line 3G1 may be connected to the third gate line 2G1 through a via hole located at the edge wiring area of the display panel. The edge wiring area of the display panel may be located around the display area of the display panel. In addition, the display panel may use the third conductive layer as a mask to perform a conducting treatment on the second active layer. That is, the region covered by the third conductive layer in the second active layer may form the channel region of the transistor, and the region not covered by the third conductive layer in the second active layer forms a conductor structure. The orthographic projection of the first gate line 3G1 on the base substrate may be located between the orthographic projection of the first conductive portion 11 on the base substrate and the orthographic projection of the second gate line G2 on the base substrate.

As shown in FIG. 8, FIG. 15, and FIG. 23, in each column of pixel circuits, the plurality of pixel circuits include first pixel circuits P1 and second pixel circuits P2 alternately arranged in sequence in the column direction. The first pixel circuits P1 may be located in the same row of pixel circuits, and the second pixel circuits P2 may be located in the same row of pixel circuits. The fourth conductive layer may include: a first bridge part 41, a second bridge part 42, a third bridge part 43, a fourth bridge part 44, a fifth bridge part 45, a sixth bridge part 46, a seventh bridge part 47, an eighth bridge part 48, a first protrusion 49, a tenth bridge part 410, a first connection line 411, a second connection line 412, a thirteenth bridge part 413, and a fourteenth bridge part 414. The first connection line 411 may be connected to a plurality of first reset signal line segments Re11 located in the same first reset signal line Re1 through the via hole H. The second connection line 412 may be connected to a plurality of second gate line segments G22 located in the same second gate line G2 through a via hole. It should be noted that the black squares in the exemplary embodiment indicate positions of the via holes, and only some of the via holes are marked in the exemplary embodiment. The square resistance of the fourth conductive layer may be smaller than the square resistance of the first conductive layer. The overall resistance of the first reset signal line Re1 may be reduced by connecting the first reset signal line segment Re11 through the first connection line 411 located on the fourth conductive layer. Therefore, the voltage drop of the first reset signal line Re1 is reduced. Similarly, by connecting the second gate line segment G22 through the second connection line 412 located on the fourth conductive layer, the overall resistance of the second gate line G2 can be reduced, thereby reducing the voltage drop of the second gate line G2. The first bridge part 41 may be located in the second pixel circuit, and the first bridge part 41 may be connected to the ninth active portion through a via hole, so as to connect with the first terminal of the fourth transistor in the second pixel circuit. The second bridge part 42 may be located in the first pixel circuit P1, and the second bridge part 42 is insulated from the fourth transistor in the first pixel circuit. The third bridge part 43 may be connected to the thirteenth active portion 713 and the first initial signal line Vinnit1 through via holes respectively, so as to connect the first terminal of the first transistor T1 and the first initial signal terminal. The fourth bridge part 44 is located at in the first pixel circuit. The fourth bridge part 44 may be connected to the ninth active portion 79 through a via hole, so as to connect with the first terminal of the fourth transistor in the first pixel circuit. The fifth bridge part 45 may be connected to the twelfth active portion 712 and the second initial signal line Vinit2 through via holes, so as to connect the first terminal of the seventh transistor and the second initial signal terminal. The sixth bridge part 46 is respectively connected to the eleventh active portion 711 and the fifteenth active portion 815 through via holes, so as to connect the second terminal of the eighth transistor, the second terminal of the first transistor, and the first terminal of the second transistor. The seventh bridge part 47 may be respectively connected to the sixteenth active portion 816 and the first conductive portion 11 through via holes, so as to connect the first terminal of the eighth transistor and the gate of the driving transistor. The third conductive portion 23 is provided with an opening 231. The orthographic projection on the base substrate of the via hole connected between the first conductive portion 11 and the seventh bridge part 47 is located within the orthographic projection of the opening 231 on the base substrate, so that the conductive structure within the via hole is insulated from the third conductive portion 23. The eighth bridge part 48 may be connected to the third conductive portion 23 and the tenth active portion 710 through via holes respectively, so as to connect the first terminal of the fifth transistor and the second electrode of the capacitor. The first protrusion 49 is connected to the second connection line 412. The first protrusion 49 is connected to the second conductive portion 22 through a via hole. The voltage of the second connection line 412 changes from a low level to a high level at the end of the compensation phase. This setting can pull up the voltage of the first conductive portion 11 at the end of the compensation phase through the coupling effect between the second conductive portion 22 and the first conductive portion 11, so that the gate voltage of the driving transistor will be slightly higher than the theoretical voltage Vdata+Vth in the light-emitting phase. That is, this setting can achieve the same driving effect through a smaller data signal voltage, so that the required data signal voltage range of the source driving circuit can be adjusted by adjusting the pull-up degree of the second connection line 412 to the first conductive portion 11, in order to match the existing source driving circuit. The tenth bridge part 410 is connected to the fourteenth active portion 714 through a via hole, so as to be connected with the second terminal of the seventh transistor. The thirteenth bridge part 413 is connected to the second initial signal line Vinit2 through a via hole. The fourteenth bridge part 414 is connected to the first initial signal line Vinit1 through a via hole.

As shown in FIG. 8, FIG. 16, and FIG. 24, the fifth conductive layer may include a plurality of first sub-power supply lines VDD1, a plurality of first data lines Da1, a plurality of second data lines Da2, a fifteenth bridge part 515, a sixteenth bridge part 516, and a seventeenth bridge part 517. The orthographic projection of the first sub-power supply line VDD1 on the base substrate, the orthographic projection of the first data line Da1 on the base substrate, and the orthographic projection of the second data line Da2 on the base substrate all extend along the second direction Y. Each column of pixel circuits is provided with a respective first sub-power supply line VDD1. The first sub-power supply line VDD1 is used to provide the first power supply terminal in FIG. 4a. The first sub-power supply line VDD1 is connected to the eighth bridge part 48 through a via hole, so as to connect the first terminal of the fifth transistor, the second electrode of the capacitor, and the first power supply terminal. The first sub-power supply line VDD1 may form a grid structure with the third conductive portion 23 connected in the first direction X, so as to reduce the self-resistance and the voltage drop of the first sub-power supply line VDD1. Each column of pixel circuits may be provided with a respective first data line Da1, and each column of pixel circuits may be provided with a respective second data line Da2. The first data line Da1 and the second data line Da2 may independently provide the data signal terminals in FIG. 4a. The first data line Da1 may be connected to the fourth bridge part 44 in the first pixel circuit P1 through a via hole, so as to connect with the first terminal of the fourth transistor in the first pixel circuit P1. The second data line Da2 may be connected to the first bridge part 41 in the second pixel circuit P2 through a via hole, so as to connect with the first terminal of the fourth transistor in the second pixel circuit P2. In addition, the second data line Da2 may also be connected to the second bridge part 42 in the first pixel circuit P1 through a via hole. The second bridge part 42 may compensate the parasitic capacitance on the second data line Da2, so that the parasitic capacitance on the first data line Da1 is similar to or equal to the parasitic capacitance on the second data line Da2. This setting can improve the display uniformity of the display panel. In addition, the orthographic projections of the second bridge part 42 and the first bridge part 41 on the base substrate may overlap with the orthographic projections on the base substrate of the conductive structures at the same position in the pixel circuit, so that the parasitic capacitances of the conductive structures in the first pixel circuit and the second pixel circuit are similar or equal. This setting can further improve the display uniformity of the display panel. For example, the conductive structure may include an eleventh active portion 711. That is, the orthographic projection of the first bridge part 41 on the base substrate overlaps with the orthographic projection of the eleventh active portion 711 on the base substrate. The orthographic projection of the second bridge part 42 on the base substrate also overlaps with the orthographic projection of the eleventh active portion 711 on the base substrate. The conductive structure may further include a first sub-power supply line VDD1, a light-shielding layer, and the like. The fifteenth bridge part 515 may be connected to the tenth bridge part 410 through a via hole, so as to connect with the second terminal of the seventh transistor. The sixteenth bridge part 516 may be connected to the fourteenth bridge part 414 through a via hole, so as to connect with the first initial signal line Vinit1. The seventeenth bridge part 517 may be connected to the thirteenth bridge part 413 through a via hole, so as to connect with the second initial signal line Vinit2.

As shown in FIG. 8 and FIG. 17, the sixth conductive layer may include: a second sub-power supply line VDD2, a third connection line 63, a fourth connection line 64, a second power supply line VSS, and an eighteenth bridge part 618. The orthographic projection of the second sub-power supply line VDD2 on the base substrate extends along the second direction Y and overlaps with the orthographic projection of the first sub-power supply line VDD1 on the base substrate. The second sub-power supply line VDD2 may be connected to the first sub-power supply line VDD1 through a via hole, so as to further reduce the resistance and the voltage drop of the first sub-power supply line. The orthographic projection of the third connection line 63 on the base substrate, the orthographic projection of the fourth connection line 64 on the base substrate, and the orthographic projection of the second power supply line VSS on the base substrate may all extend along the second direction Y. Every three adjacent columns of pixel circuits is provided with a respective third connection line 63, a respective fourth connection line 64, and a respective second power supply line VSS. The third connection line 63 may be connected to the sixteenth bridge part 516 through a via hole, for connecting to the first initial signal line Vinit1 intersected therewith. The first initial signal line Vinit1 meshed through the third connection line 63 may have a smaller resistance and a smaller voltage drop. The fourth connection line 64 may be connected to the seventeenth bridge part 517 through a via hole, for connecting to the second initial signal line Vinit2 intersected therewith. The second initial signal line Vinit2 meshed through the fourth connection line 64 may have a smaller resistance and a smaller voltage drop. The eighteenth bridge part 618 may be connected to the fifteenth bridge part 515 through a via hole, so as to connect to the second terminal of the seventh transistor T7. The eighteenth bridge part 618 may also be used to connect with the first electrode of the light-emitting unit. The second power supply line VSS may be used to provide the second power supply terminal in FIG. 4*a*. The second power supply line VSS may be connected to the second electrode of the light-emitting unit through a via hole located in the edge wiring area of the display panel. The second electrode of the light-emitting unit may be a common electrode. The second electrode of the light-emitting unit may be located on the side of the first electrode of the light-emitting unit away from the base substrate. This setting can reduce the resistance and the voltage drop of the second electrode of the light-emitting unit.

It should be noted that, as shown in FIGS. 8, 23, and 24, the black square illustrated on the side of the fourth conductive layer away from the base substrate indicates that the fourth conductive layer is connected to the via hole of another layer on the side facing the base substrate. The black square illustrated on the side of the fifth conductive layer away from the base substrate indicates that the fifth conductive layer is connected to the via hole of another layer on the side facing the base substrate. The black square illustrated on the side of the sixth conductive layer away from the base substrate indicates that the sixth conductive layer is connected to the via hole of another layer on the side facing the base substrate. The black square only indicates the position of the via hole. Different via holes represented by black squares at different positions may penetrate through different insulation layers.

Figure 25:
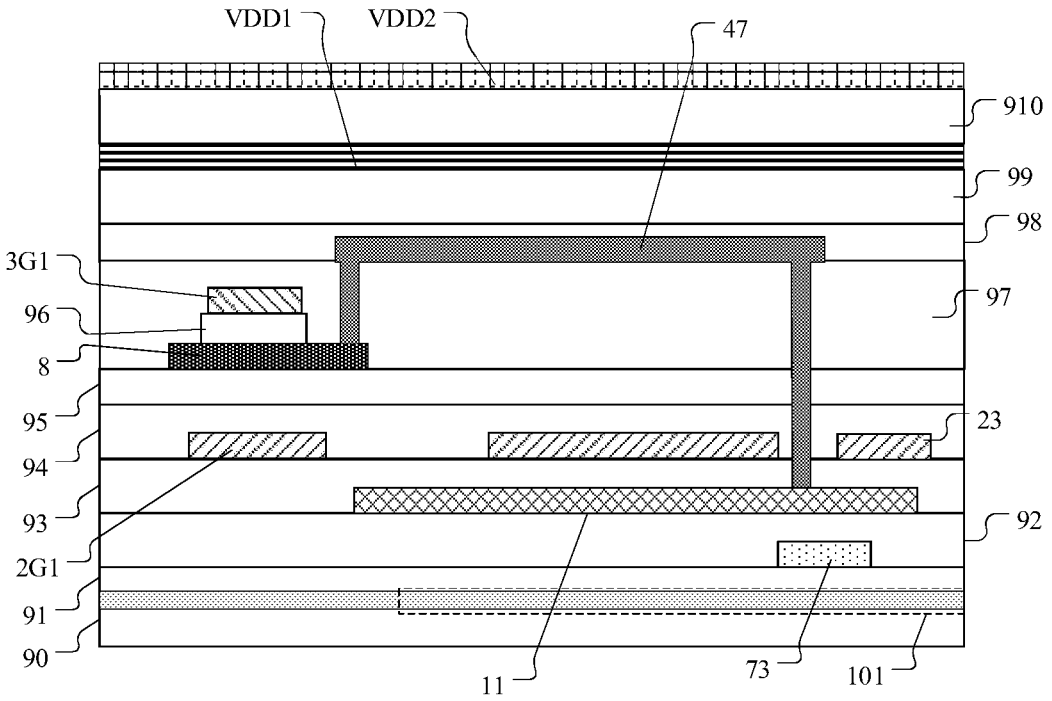
FIG. 25 is a partial cross-sectional view taken along the dotted line AA of the display panel in FIG. 8.

As shown in FIG. 25, it is a partial cross-sectional view taken along the dotted line AA of the display panel in FIG. 8. The display panel may further include a first buffer layer 91, a first insulation layer 92, a second insulation layer 93, a first dielectric layer 94, a second buffer layer 95, a third insulation layer 96, a second dielectric layer 97, a passivation layer 98, a first planarization layer 99, and a second planarization layer 910. The base substrate 90, the light-shielding layer, the first buffer layer 91, the first active layer, the first insulation layer 92, the first conductive layer, the second insulation layer 93, the second conductive layer, the first dielectric layer 94, the second buffer layer 95, the second active layer, the third insulation layer 96, the third conductive layer, the second dielectric layer 97, the fourth conductive layer, the passivation layer 98, the first planarization layer 99, the fifth conductive layer, the second planarization layer 910, and the sixth conductive layer are stacked in sequence. The first insulation layer 92, the second insulation layer 93, and the third insulation layer 96 may be a single-layer structure or a multi-layer structure. The materials of the first insulation layer 92, the second insulation layer 93, and the third insulation layer 96 may be at least one of silicon nitride, silicon oxide, and silicon oxynitride. The first buffer layer 91, the second buffer layer 95, the first dielectric layer 94, and the second dielectric layer 97 may be layers of silicon nitride. The materials of the first planarization layer 99 and the second planarization layer 910 may be an organic material, such as polyimide (PI), polyethylene terephthalate (PET), polyethylene naphthalate (PEN), silicon-glass bonding structure (SOG), and other materials. The base substrate 90 may include a glass substrate, a barrier layer, and a polyimide layer stacked in sequence. The barrier layer may be an inorganic material. The materials of the first conductive layer, the second conductive layer, and the third conductive layer may be one of molybdenum, aluminum, copper, titanium, niobium, or may be an alloy thereof, or may be a molybdenum-titanium alloy or laminated layer. The materials of the fourth conductive layer, the fifth conductive layer, and the sixth conductive layer may include metal materials, such as one of molybdenum, aluminum, copper, or titanium, niobium, or an alloy thereof, or a molybdenum-titanium alloy or laminated layer, etc., or a titanium-aluminum-titanium laminated layer. In addition, the display panel may further include an electrode layer, a pixel definition layer, etc. located on the side of the sixth conductive layer away from the base substrate. The electrode layer may be used to form the first electrode of the light-emitting unit.

Figure 26:
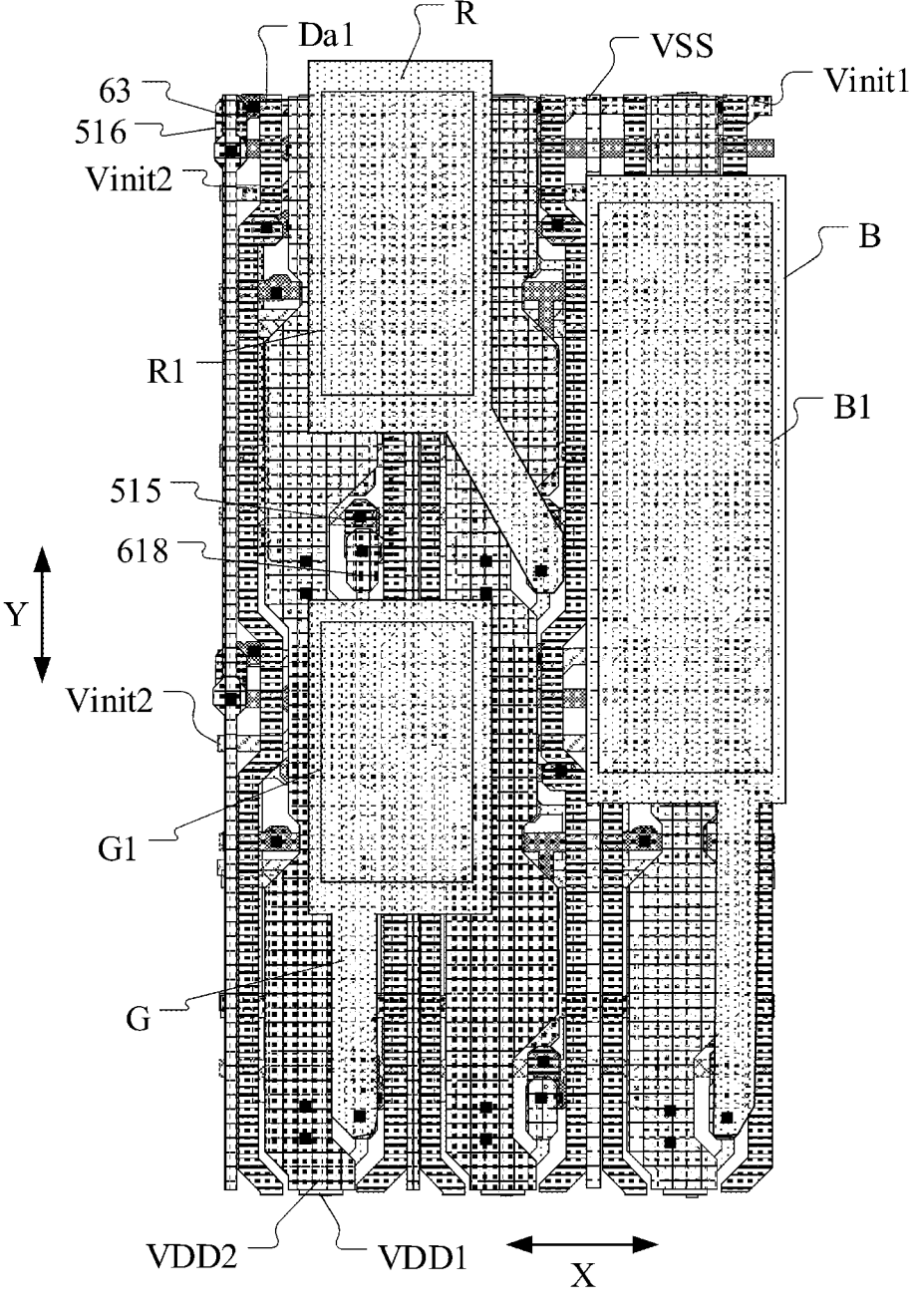
FIG. 26 is a schematic structural diagram of a display panel according to another exemplary embodiment of the present disclosure.

As shown in FIG. 26, it is a schematic structural diagram of a display panel according to another exemplary embodiment of the present disclosure. The display panel may include the display panel shown in FIG. 8. Besides, the display panel may further include the electrode layer located on one side of the sixth conductive layer away from the base substrate. The electrode layer may include a plurality of electrode parts R, an electrode part G, and an electrode part B. The electrode part R may be used to form the first electrode of the red light-emitting unit, the electrode part G may be used to form the first electrode of the green light-emitting unit, and the electrode part B may be used to form the first electrode of the blue light-emitting unit. Each electrode part may be connected to the eighteenth bridge part 618 through a via hole for connecting with the second terminal of the seventh transistor T7. The display panel may also include a pixel definition layer located on the side of the electrode layer away from the base substrate. A plurality of openings for setting light-emitting units may be formed on the pixel definition layer. As shown in FIG. 26, the opening R1 on the electrode part R, the opening G1 on the electrode part G, and the opening B1 on the electrode part B may be formed on the pixel definition layer.

It should be noted that the scale in the drawings of the present disclosure may be used as a reference in the actual process, but is not limited thereto. For example, the width-to-length ratio of the channel, the thickness and the spacing of each film layer, and the width and the spacing of each signal line, may be adjusted according to actual needs. The number of pixels in the display substrate and the number of sub-pixels in each pixel are not limited to the numbers shown in the figures. The figures described in the present disclosure are only structural schematic diagrams. In addition, the first, second and other qualifiers are only used to define different structural names, and they have no meaning of a specific order.

An exemplary embodiment further provides a display device, which includes the above-mentioned display panel. The display device may be a display device such as a mobile phone, a tablet computer, or a television.

Other embodiments of the present disclosure will be readily apparent to those skilled in the art from consideration of the specification and practice of the contents herein. The present application is intended to cover any modification, use or adaptation of the present disclosure. These modifications, uses or adaptations follow the general principle of the present disclosure, and include common knowledge or conventional technical means in the technical field that are not disclosed in the present disclosure. The specification and examples are to be considered exemplary only, with the true scope and spirit of the present disclosure indicated by the appended claims.

It should be understood that the present disclosure is not limited to the precise constructions which have been described above and shown in the drawings, and various modifications and changes may be made without departing from the scope thereof. The scope of the present disclosure is limited only by the appended claims.

The invention claimed is:

1. A display panel, wherein the display panel comprises a pixel circuit, wherein the pixel circuit comprises:

a driving circuit, connected to a first node, a second node, and a third node, and used for inputting a driving current to the third node through the second node according to a signal at the first node;

an isolation circuit, connected to the first node, a fourth node, and a first gate driving signal terminal, and used for connecting the first node and the fourth node in response to a signal at the first gate driving signal terminal;

a compensation circuit, connected to the third node, the fourth node, and a second gate driving signal terminal, and used for connecting the third node and the fourth node in response to a signal at the second gate driving signal terminal;

a first reset circuit, connected to the fourth node, a first reset signal terminal, and a first initial signal terminal, and used for transmitting a signal at the first initial signal terminal to the fourth node in response to a signal at the first reset signal terminal, wherein the display panel comprises:

a plurality of pixel circuits, arranged in an array along a row direction and a column direction;

wherein each pixel circuit comprises a light-emission control circuit connected to an enable signal terminal, and the display panel further comprises:

a plurality of first gate lines, wherein each row of pixel circuits is provided with a respective first gate line, and each first gate line is connected to the first gate driving signal terminal in a respective pixel circuit;

a plurality of second gate lines, wherein each row of pixel circuits is provided with a respective second gate line, and each second gate line is connected to the second gate driving signal terminal in a respective pixel circuit;

a plurality of enable signal lines, wherein each row of pixel circuits is provided with a respective enable signal line, and each enable signal line is connected to the enable signal terminal in a respective pixel circuit; and a plurality of pixel circuit groups, each comprising two adjacent rows of pixel circuits, wherein, in a same pixel circuit group, signals at two of the first gate lines are the same in timing, signals at two of the second gate lines are the same in timing, and signals at two of the enable signal lines are the same in timing.

2. The display panel according to claim 1, wherein the display panel further comprises:

a plurality of first data lines, wherein each column of pixel circuits is provided with a respective first data line, and each first data line is connected to the data signal terminals of a respective odd row of pixel circuits;

a plurality of second data lines, wherein each column of pixel circuits is provided with a respective second data line, and each second data line is connected to the data signal terminals of a respective even row of pixel circuits.

3. The display panel according to claim 1, wherein each pixel circuit comprises a second reset circuit connected to a second reset signal terminal, and the display panel further comprises:

a plurality of reset signal lines, wherein each row of pixel circuits is provided with a respective reset signal line, and each reset signal line is connected to the first reset signal terminal in the pixel circuit of a respective row and the second reset signal terminal in the pixel circuit of a previous row, wherein, in a same pixel circuit group, signals at two of the reset signal lines are the same in timing.

* * * * *